United States Patent [19]
Roberts et al.

[11] Patent Number: 5,573,837
[45] Date of Patent: Nov. 12, 1996

[54] MASKING LAYER HAVING NARROW ISOLATED SPACINGS AND THE METHOD FOR FORMING SAID MASKING LAYER AND THE METHOD FOR FORMING NARROW ISOLATED TRENCHES DEFINED BY SAID MASKING LAYER

[75] Inventors: Ceredig Roberts; Alan R. Reinberg, both of Boise, Id.

[73] Assignee: Micron Technology, Inc., Boise, Id.

[21] Appl. No.: 405,552

[22] Filed: Mar. 14, 1995

Related U.S. Application Data

[60] Continuation-in-part of Ser. No. 86,412, Jun. 30, 1993, abandoned, which is a division of Ser. No. 872,747, Apr. 22, 1992, Pat. No. 5,254,218.

[51] Int. Cl.⁶ .................................................. H01L 21/306
[52] U.S. Cl. ...................... 428/210; 257/341; 257/506; 257/510; 257/515; 257/520; 257/647; 428/195; 428/446; 428/698; 428/701; 428/702
[58] Field of Search .................................. 428/446, 701, 428/702, 698, 210, 195; 357/42, 50, 49, 55; 257/341, 506, 510, 515, 520, 647

[56] References Cited

U.S. PATENT DOCUMENTS

| | | | |
|---|---|---|---|
| 3,962,717 | 6/1976 | O'Brien | 357/44 |
| 4,255,207 | 3/1981 | Nicolay et al. | 148/174 |
| 4,269,636 | 5/1981 | Rivoli et al. | 148/175 |
| 4,502,914 | 3/1985 | Trumpp et al. | 156/643 |
| 4,598,461 | 7/1986 | Love | 29/571 |
| 4,657,630 | 4/1987 | Agatsuma | 156/643 |
| 4,882,291 | 11/1989 | Jeuch | 437/34 |
| 5,047,117 | 9/1991 | Roberts | 156/643 |
| 5,053,105 | 10/1991 | Fox, III | 156/643 |

*Primary Examiner*—Archene Turner
*Attorney, Agent, or Firm*—Susan B. Collier

[57] ABSTRACT

An etch mask having a narrow spacer layer self-aligned and adjacent to a first portion of an inorganic first layered segment. An inorganic second layered segment comprises a portion of the etch mask and encompasses a perimeter of the first layered segment and is distanced from the first layered segment by a distance equal to a thickness of the narrow spacer layer. A first portion of the second layered segment is adjacent to the narrow spacer layer. A void exists between second portions of the first and the second layered segments. The area of the substrate exposed by the etch mask of the invention, when etched, forms a trench whose width is limited only by the width of the void which is equal to the width of the narrow spacer layer. The narrowness of the narrow isolated trench formed using the etch mask of the invention maximizes die space.

10 Claims, 27 Drawing Sheets

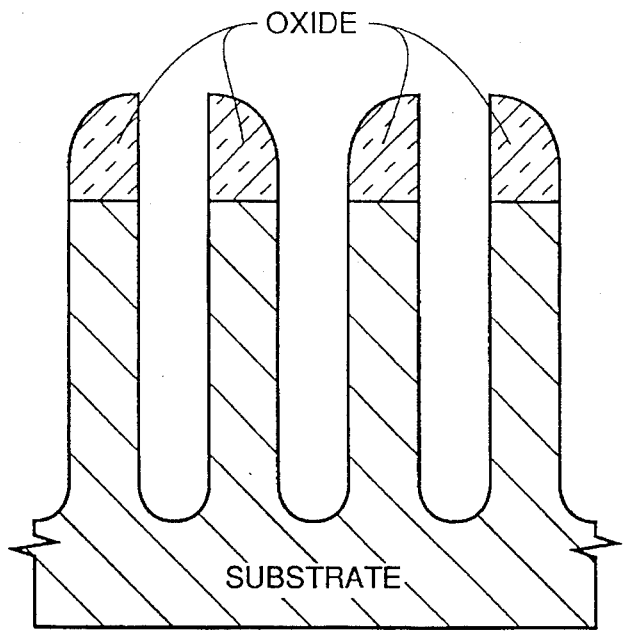
FIG. 3
(PRIOR ART)
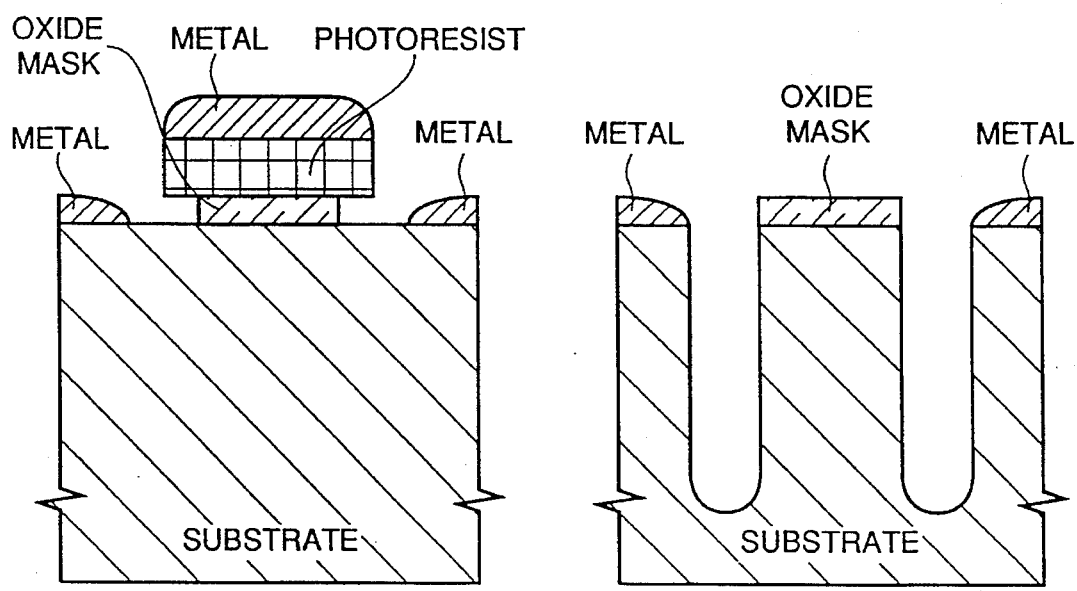
FIG. 4A
(PRIOR ART)
FIG. 4B
(PRIOR ART)

MASKING LAYER HAVING NARROW ISOLATED SPACINGS AND THE METHOD FOR FORMING SAID MASKING LAYER AND THE METHOD FOR FORMING NARROW ISOLATED TRENCHES DEFINED BY SAID MASKING LAYER

This application is a continuation-in-part of application Ser. No. 08/086,412 filed Jun. 30, 1993, now abandoned, in which is a continuation of application Ser. No. 07/872,747 filed on Apr. 22, 1992 now U.S. Pat. No. 5,254,218.

FIELD OF THE INVENTION

This invention relates to semiconductor manufacturing technology and, more particularly, to photolithography masking techniques used to provide feature dimensions which transcend the resolution limits of available photolithography.

BACKGROUND OF THE INVENTION

Since the late 1960's, a new generation of integrated circuits has been developed approximately every four years. Each generation has been characterized by a halving of device dimensions, resulting in a four-fold density increase over the preceding generation. Increases in circuit density have been consistently limited by the resolution of the available photolithographic equipment. The minimum size of features and spaces that a given piece of photolithographic equipment can produce is directly related to its resolution capability.

It has long been recognized, by those skilled in the fabrication of integrated circuits, that vertical film layers as thin as $0.01\mu$ can be grown with a high degree of accuracy. Also, layers as thin as $0.1\mu$ can be deposited by low pressure chemical vapor deposition, hereinafter known as LPCVD. By comparison, the minimum feature size, producible with the present generation of photolithography equipment used to produce 1-megabit SRAMs and 4-megabit DRAMs, is approximately $0.6\mu$. If deposition layers can be used to define horizontal dimensions within integrated circuits, the result will be increased circuit density.

Many die are typically fabricated on a singular semiconductor wafer. Complex circuitries are created on each die. Because of increasing device density on die, it is necessary to enhance the isolation of the different devices to ensure that no current flows through the substrate from one device to another. In FIG. 1, two active areas are isolated from each other by a field oxide region that has been thermally grown using a standard Locos process. During field oxide growth, patches of silicon nitride protect future active areas from oxidation. Electrical devices (e.g., transistors, resistors, capacitors) will ultimately be fabricated in the active areas. The oxide layer must be of relatively large width to ensure that there is no leakage current from one area to another. This leakage current is the result of what is termed bipolar latch up in the case where the two regions are of opposite types; that is, one is n type and the other is p type. Similar regions are also susceptible to leakage current.

In order to reduce the horizontal width of the oxide layer and maximize die space, trenches have been created via several processes. The trenches, filled with an insulative material such as silicon dioxide, extend into the substrate and act as insulating walls between active areas. Because trenches extend into the substrate, they can prevent bipolar latch up even though they may be narrower than the field oxide region of FIG. 1. In fact, the width can now be as narrow as present technology allows. FIG. 2 shows a trench manufactured with polycrystalline silicon deposited over an oxide region. The trench width is difficult to precisely predict when using this method due to variations in the polycrystalline silicon deposition. FIG. 3 depicts trench fabrication using an oxide mask created with a pitch doubling process that is the subject of a copending U.S. Pat. application submitted by Tyler Lowrey and Randal Chance of Micron Technology, Inc. and accorded Ser. No. 519,992, entitled "Method for Reducing, by a Factor of $2^{-N}$, the Minimum Masking Pitch of a Photolithographic Process Used in the Fabrication of an Integrated Circuit". In FIG. 4A an oxide mask is formed by under-etching the photoresist. Next, metal is sputtered onto the wafer. The photoresist shields a portion of the substrate next to the oxide mask from the metal. After the wafer has been sputtered, the metal covering the photoresist is lifted and the photoresist is etched producing a mask of metal and oxide for trench formation, FIG. 4B. There is a percentage of error in the predictability of trench size due to the nature of the sputtering process because of the unpredictable shielding effect of the photoresist. FIGS. 5A and 5B depict trench fabrication that is the subject of U.S. Pat. No. 4,502,914. This invention provides a structure of polymeric material with vertical sidewalls, the latter serving to make sidewall structures of silicon dioxide or nitride with dimensions in the sub-micrometer range. These sidewall structures can be used as masks directly. For the negative lithography, another layer is alternatively applied over the sidewall structures using a planarization which is partly removed until the peaks of the sidewall structures are exposed. Subsequently the sidewall structures themselves are removed. The resulting opening can then be used as a mask for trench formation. Providing uniformity of the planarization layer over the sidewall structures can be difficult using this method due to the fact that the sidewall structures can disrupt the flow of resist or other material during the spin.

Since the trenches are fabricated after the substrate has been exposed, the key to narrow, self-aligned isolation trenches is exposing a highly predictable narrow substrate region. The etch mask fabrication of the present embodiment facilitates even narrower, self-aligned trenches, with a minimum amount of masking steps using a deposition layer as a masking layer to precisely define the narrow spacing.

SUMMARY OF THE INVENTION

This invention utilizes a primary mask of photoresist, created using conventional photolithography, to create the inorganic mask of the invention, having a vertical film layer segment defining narrow isolated spacings. The primary mask patterns a silicon dioxide layer segment, also referred to as a mask island. The silicon dioxide layer segment is part of the inorganic mask and two of its opposing sides define the inner walls of the narrow isolated spacings. An expendable spacer layer is deposited on top of the silicon dioxide layer segment and an exposed starting substrate. The starting substrate may be fabricated to overlie other substrates; such would be the case when a silicon substrate is fabricated to overlie a sapphire substrate. This is known as silicon on sapphire (SOS). The thickness of the expendable spacer layer determines the width of the isolated trenches in the secondary mask. The width may be as narrow as $0.1\mu$. The spacer layer may be polycrystalline silicon deposited by LPCVD. A thick inorganic protective layer is blanket deposited on top of the spacer layer, the primary consideration being that the spacer layer must be etchable with a high degree of selectivity over the protection layer. A blanket deposition of photoresist follows which results in the planarization of the in-process wafer. The protective layer and photoresist are then plasma etched at the same rate in order to expose the spacer layer adjacent to and capping the silicon dioxide segment, the balance of the spacer layer remaining covered by the protective layer. Next opposing ends of the silicon dioxide layer segment are masked to protect at least a width of the ends equal to the thickness of the spacer layer. The foregoing process creates the secondary etch mask. At this point, the exposed portions of the spacer layer are etched away to create the narrow isolated spacings and to expose the substrate that is adjacent to the two opposing sides of the silicon dioxide layer segment that was not masked. A further aspect of the invention comprising the process of etching narrow isolated trenches in the substrate according to the secondary mask. The narrow isolated trenches formed in the substrate are self-aligned to the two opposing sides of the silicon dioxide layer segment. The two opposing sides of the silicon dioxide layer segment define the inner walls and the remaining spacer layer defines the outer walls of the substrate trenches thus formed.

Because the width of the narrow isolated spacings is dependent on the thickness of the expendable spacer layer, very narrow trench widths are possible. In addition, the resulting trenches are self-aligned to two opposing sides of the silicon dioxide layer segment. The process is easily adapted to current manufacturing techniques and has minimum manufacturing problems.

This masking technique may be used to create a variety of semiconductor structures.

BRIEF DESCRIPTION OF THE DRAWINGS

FIGS. 2, 3, 4A, 4B, 5A and 5B depict the prior art trench isolation of integrated circuit regions.

FIGS. 6 through 28 depict a portion of an in-process wafer during different process stages of the invention. Figures representing contemporaneous process stages have identical ordinal number designations (e.g., FIGS. 5A and 5B are contemporaneous views). Each "A" view is a cross section through the contemporaneous top planer "B" view.

DETAILED DESCRIPTION OF THE PREFERRED EMBODIMENT

In the semiconductor industry, electronic circuitry is fabricated on silicon substrate. The present invention is a trench mask defining having narrow isolated spacings and the method for fabricating same. A further aspect of the invention is the method for fabricating narrow isolated trenches in the substrate, said fabricating performed according to the trench mask. The fabrication is very flexible and may be used to pattern a multitude of features within semiconductor circuitry. Although the present embodiment emphasizes the fabrication of a trench mask defining two narrow isolated spacings a trench mask defining a plurality of narrow isolated spacings may be fabricated. Thus, a plurality of narrow isolated trenches may be fabricated by duplicating the following method pertinent to the fabrication of two narrow isolated trenches.

In FIGS. 6 through 28., the "A" figures represent a cross sectional view of narrow spacing and trench fabrication processes and the "B" figures represent a top planar view of each corresponding figure "A".

Figure 1:
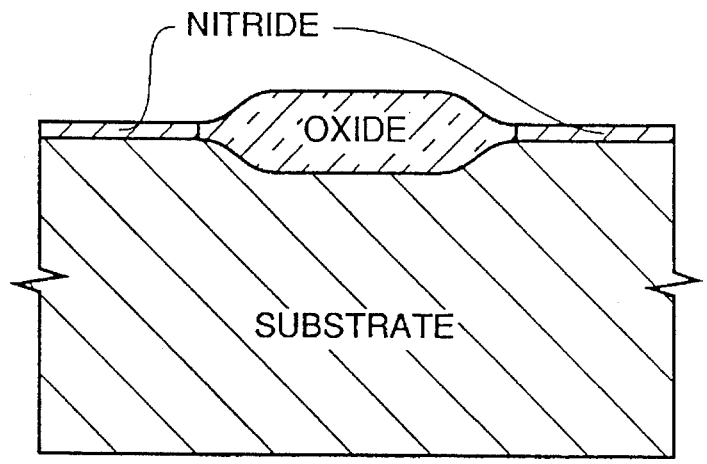
FIG. 1 depicts the prior art isolation of integrated circuit regions.
Figure 2:
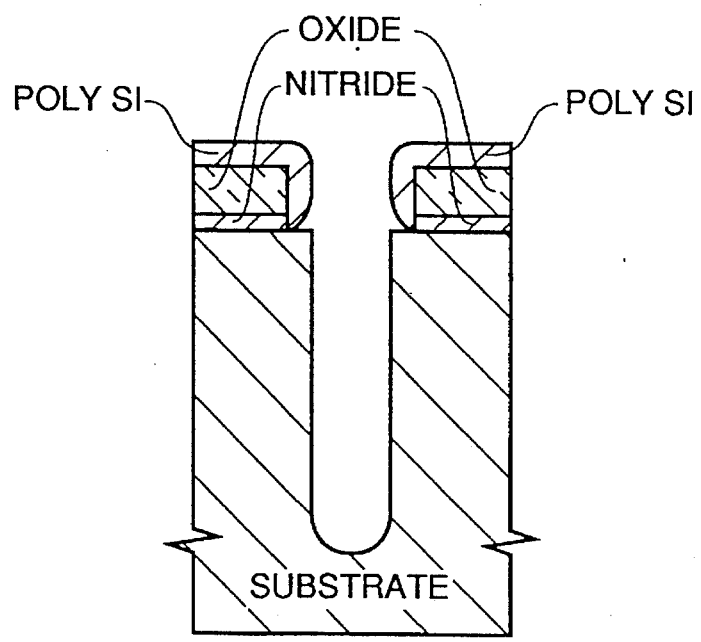
Figure 5A:
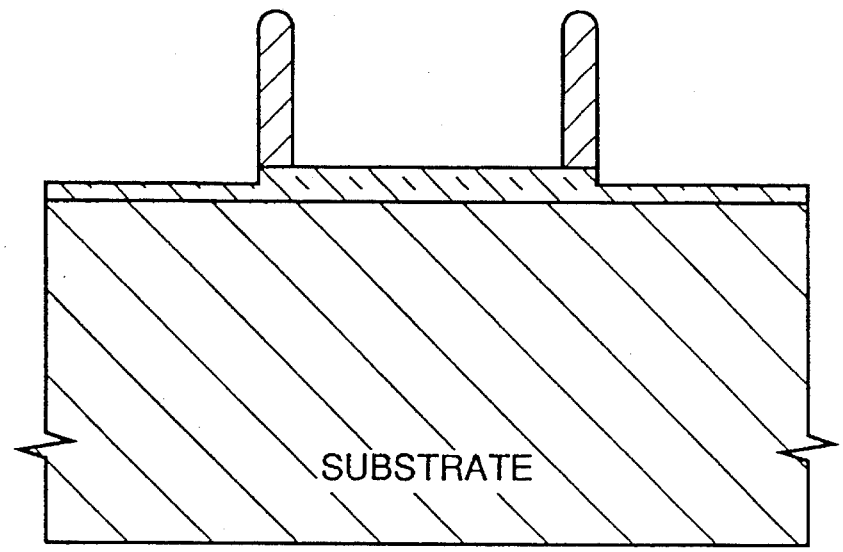
Figure 5B:
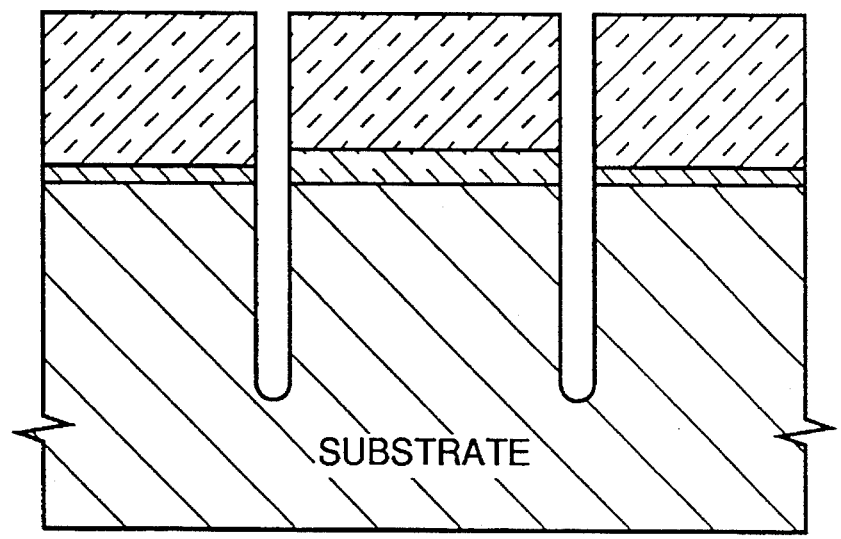
Figure 6A:
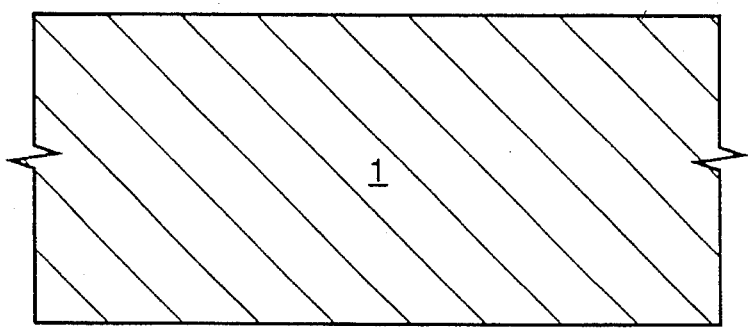
FIGS. 6A and 6B are unprocessed silicon substrate.
Figure 6B:
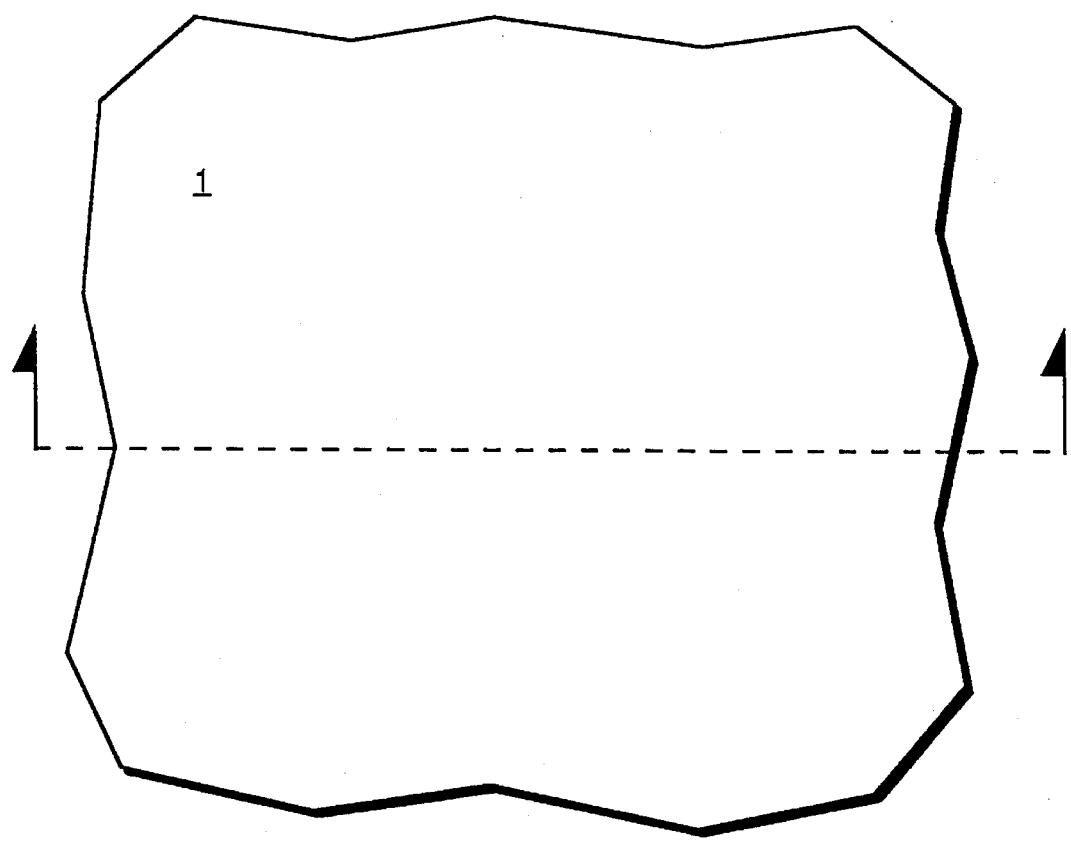

FIGS. 6A and 6B depict a portion of an in-process silicon wafer showing substrate 1.

Figure 7A:
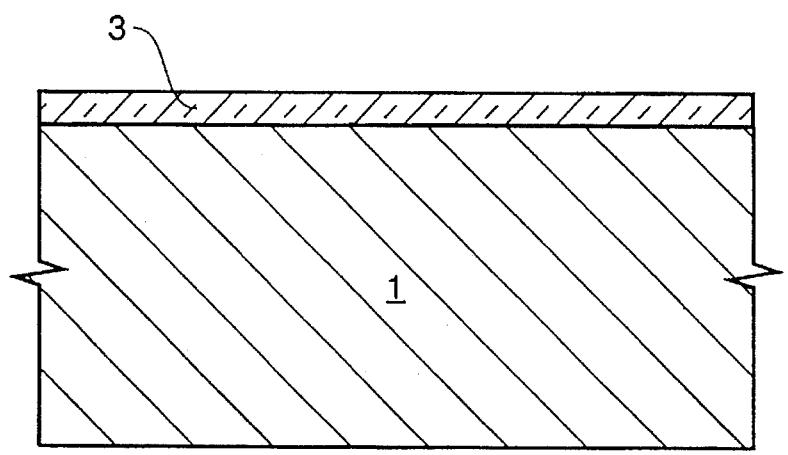
FIGS. 7A and 7B represent the substrate of FIGS. 6A and 6B, respectively, following the thermal growth of a thin-oxide layer.
Figure 7B:
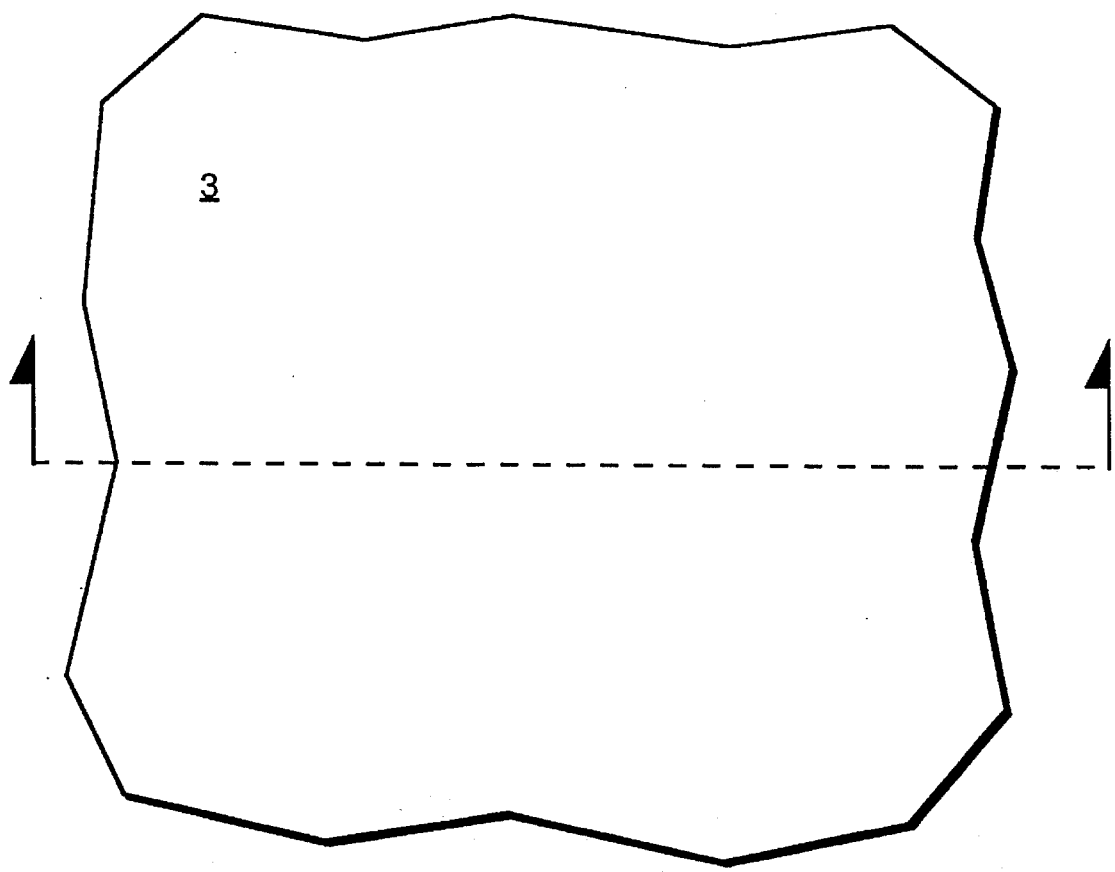

In FIGS. 7A and 7B, a thin oxide layer 3 is thermally grown in a diffusion oven. The thin oxide layer 3 offers protection for the substrate 1 during subsequent layerization and etching.

Figure 8A:
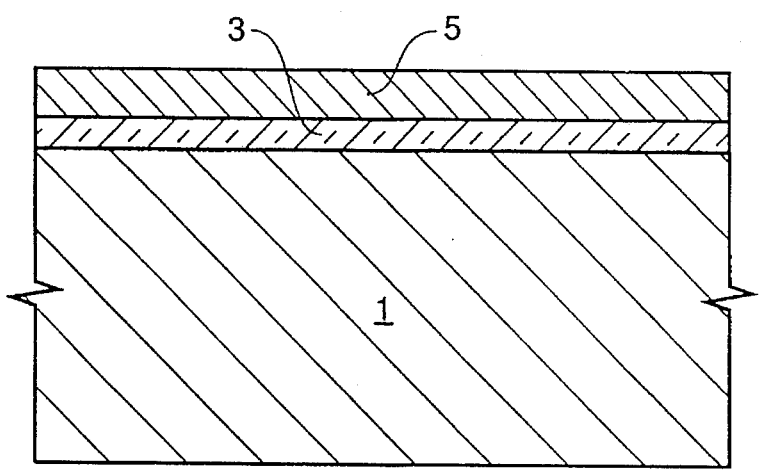
FIGS. 8A and 8B represent the in-process wafer portion of FIGS. 7A and 8A, respectively, following the blanket deposition of nitride.
Figure 8B:
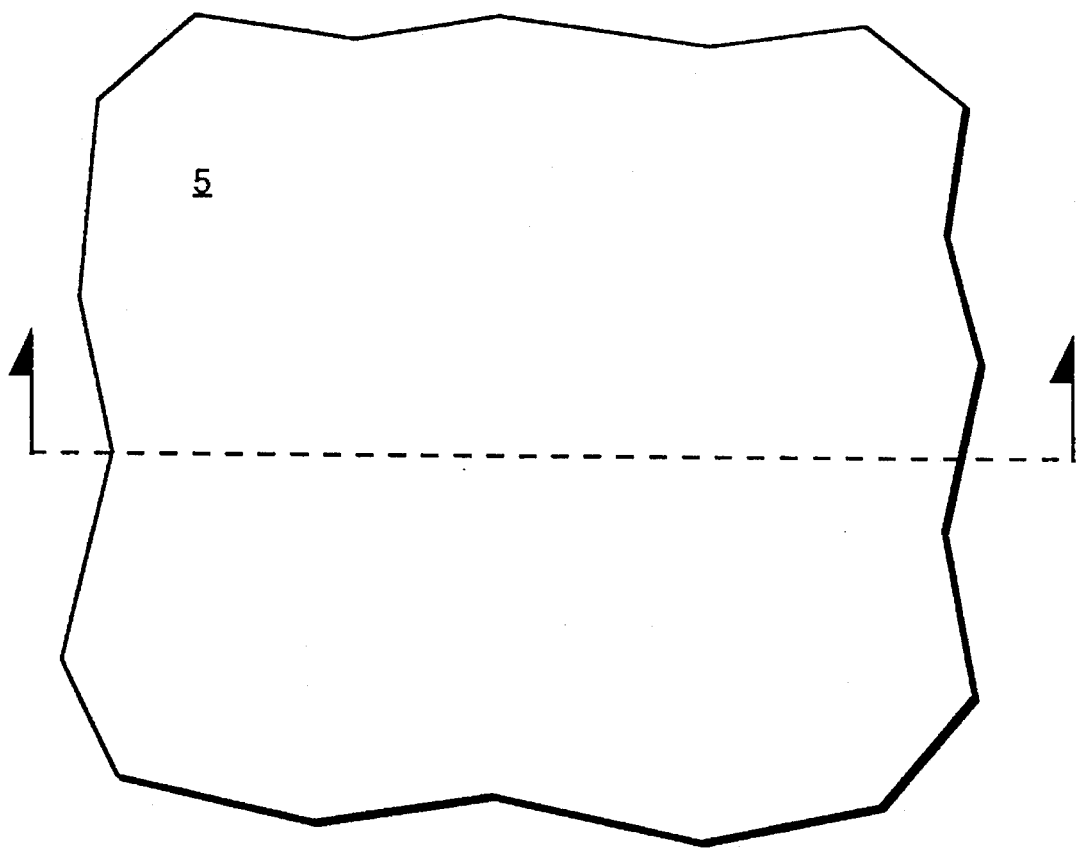

In order to provide a future barrier against oxidation of substrate 1 during subsequent circuit fabrication steps, a nitride layer 5 may be optionally deposited by low pressure chemical vapor deposition (LPCVD) as shown in FIGS. 8A and 8B.

Figure 9A:
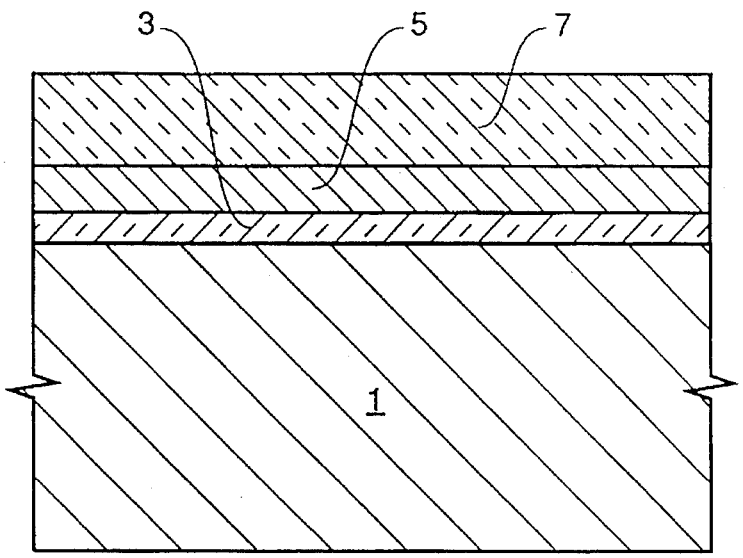
FIGS. 9A and 9B represent the in-process wafer portion of FIGS. 8A and 8B, respectively, following the deposition of a base layer of silicon dioxide.
Figure 9B:
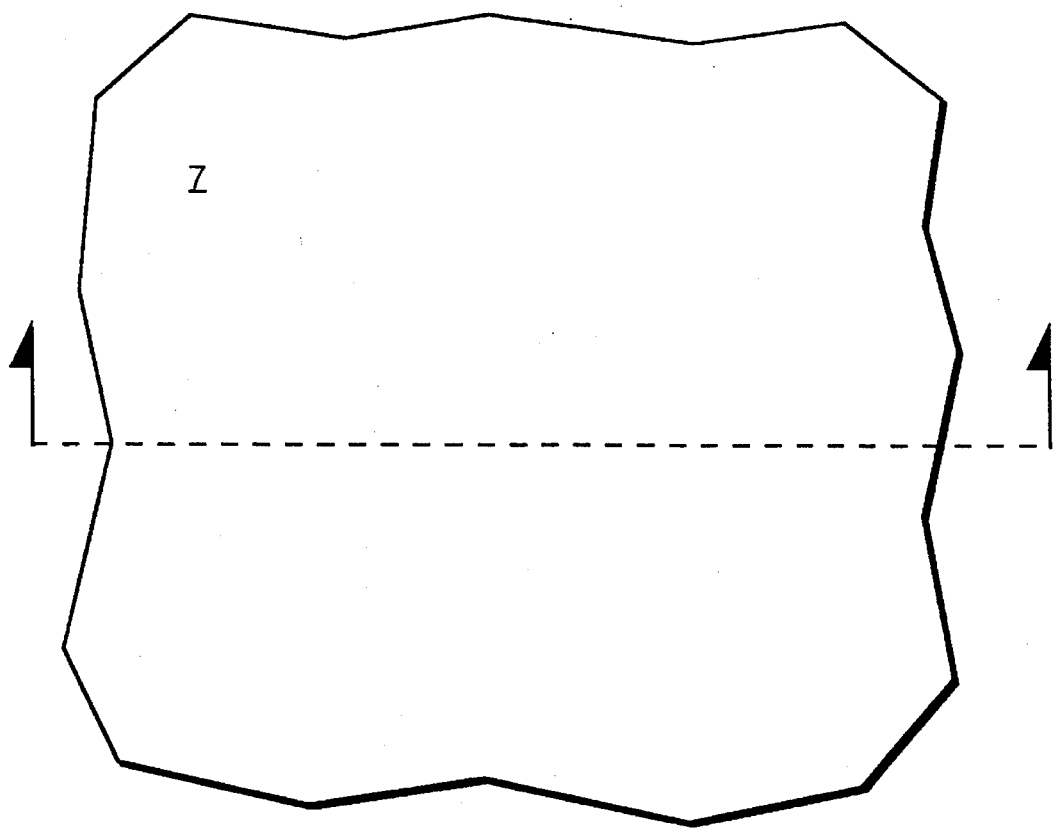
Figure 10A:
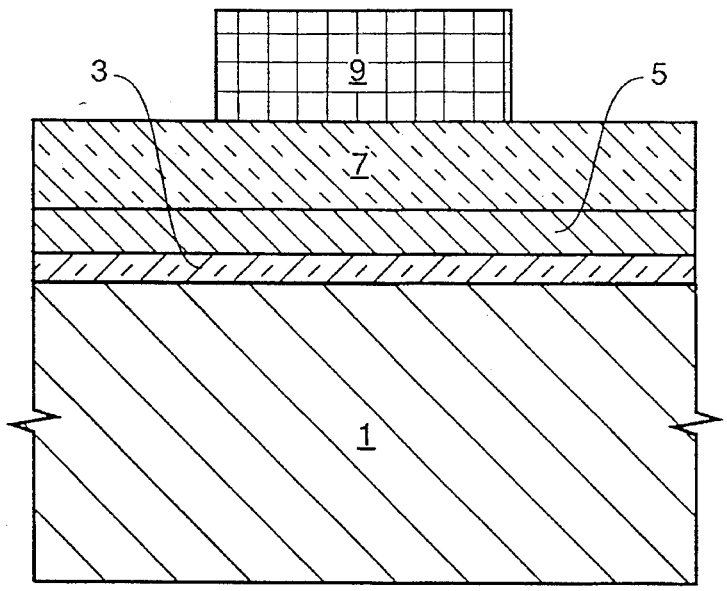
FIGS. 10A and 10B represent the in-process wafer portion of FIGS. 9A and 9B, respectively, following the masking of the base layer of silicon dioxide with photoresist oxide.
Figure 10B:
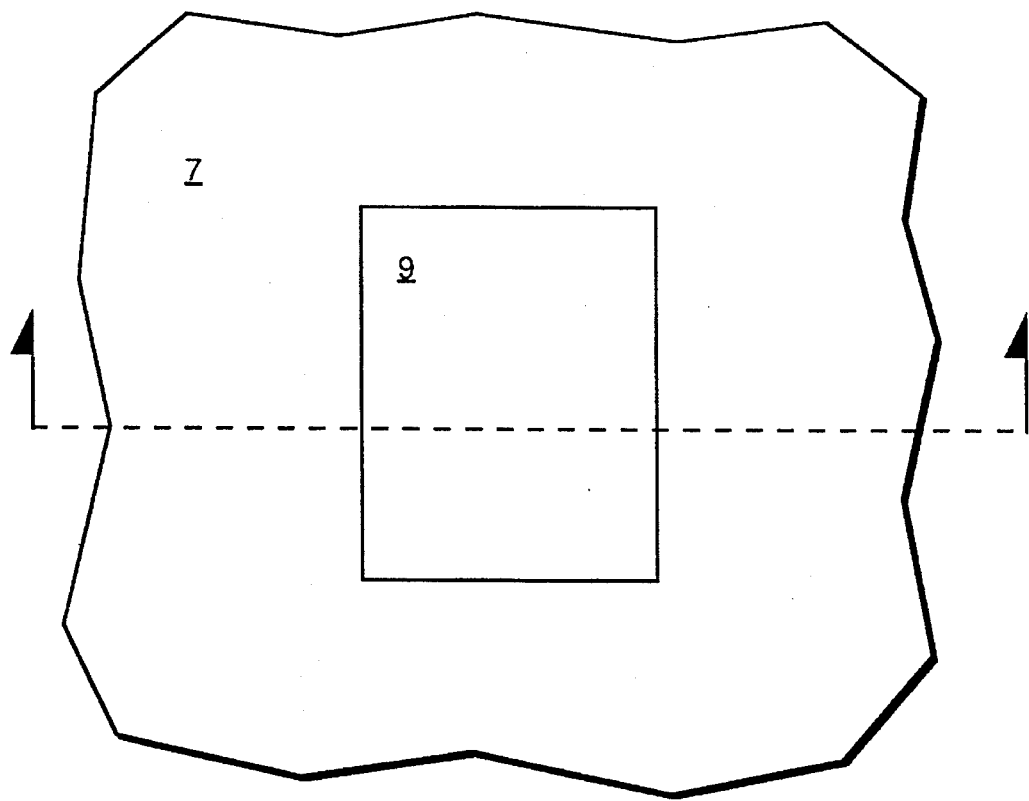

FIGS. 9A and 9B show the initial layerization of the in-process wafer after deposition of a base layer of silicon dioxide 7. The layerization is conventionally masked with a primary photoresist mask 9 shown in FIGS. 10A and 10B.

Figure 11A:
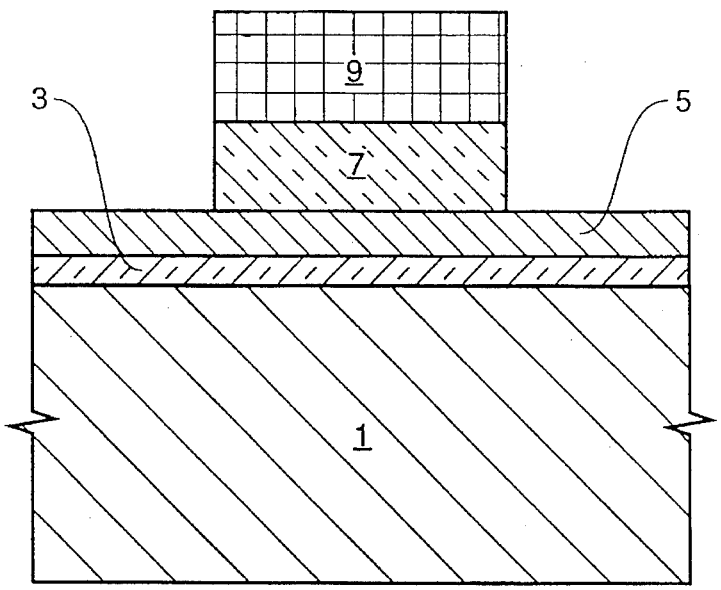
FIGS. 11A and 11b represent the in-process wafer portions of FIGS. 10A and 10B, respectively, following an etch of the base layer of silicon dioxide to form a mask island.
Figure 11B:
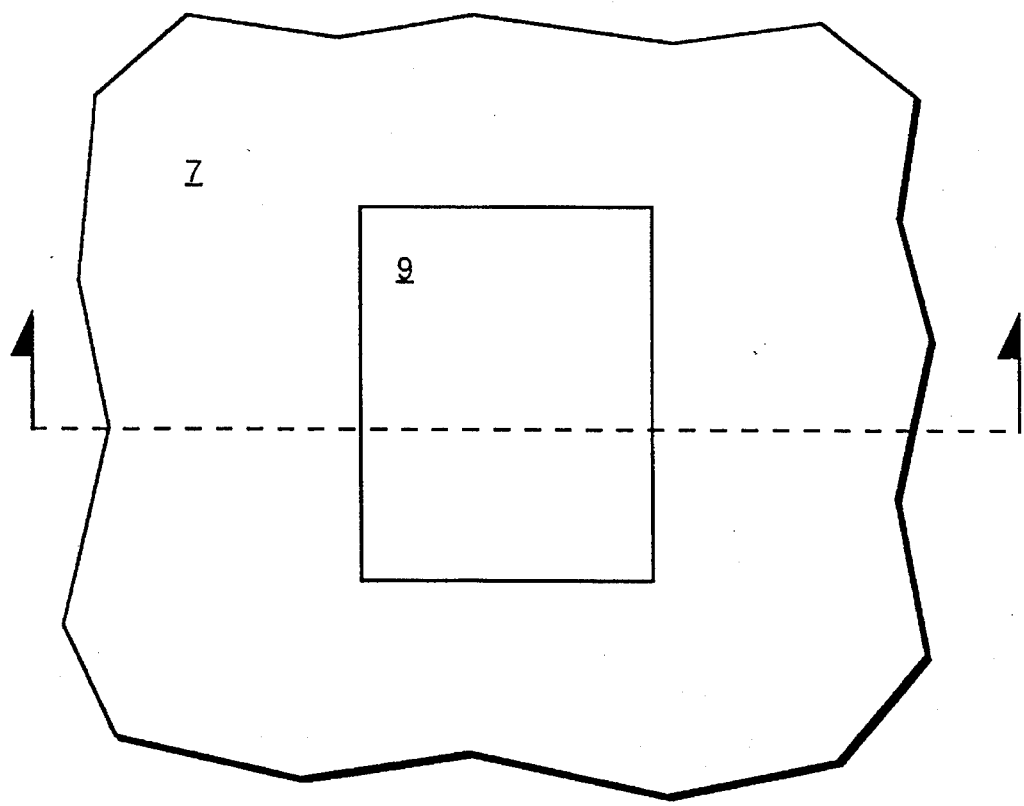

FIGS. 11A and 11b depict the layerization after an anisotropic etch of the base layer of silicon dioxide 7, the optional nitride layer 5 and thin oxide layer 3 remaining intact.

Figure 12A:
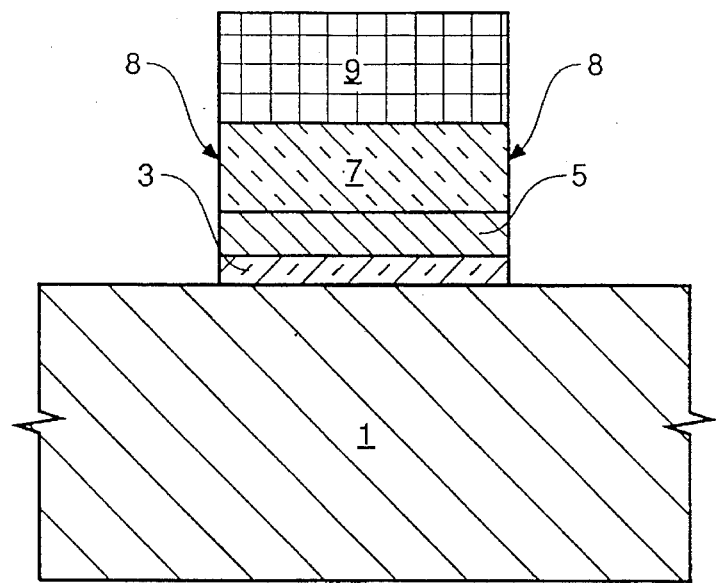
FIGS. 12A and 12B represent the in-process wafer portion of FIGS. 11A and 11B, respectively, following an etch of the nitride layer and the thin oxide layer, said etch completing the formation of the mask island.
Figure 12B:
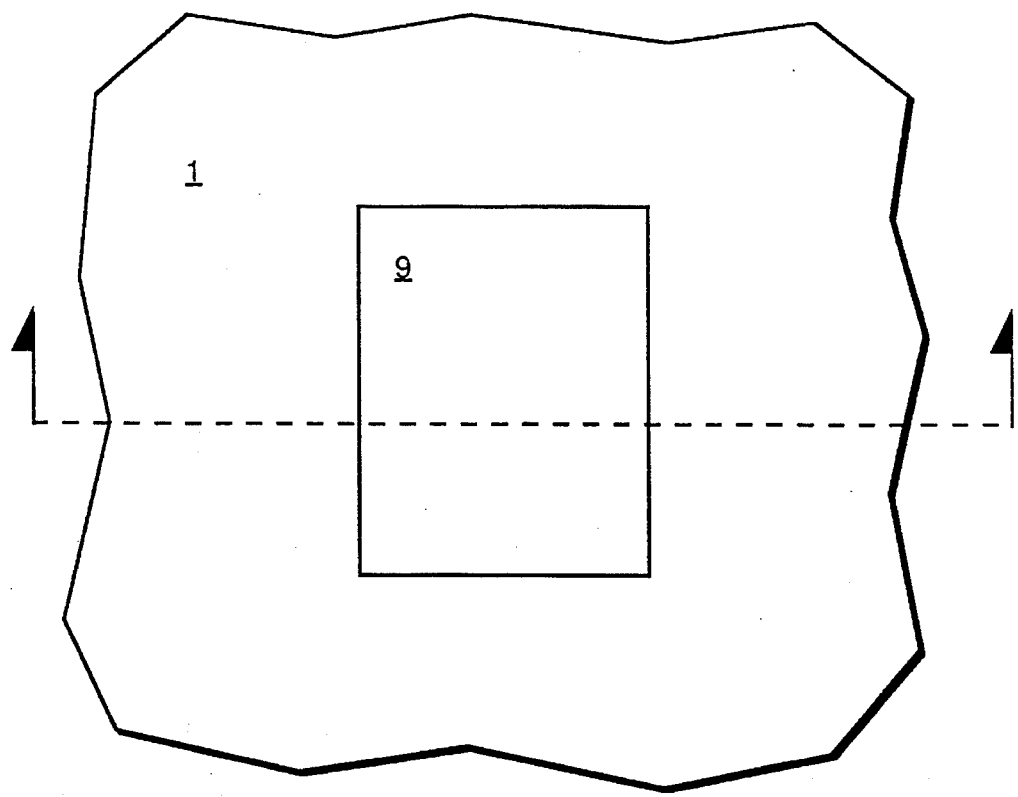

The optional nitride layer 5 is etched to form a layered segment also referred to as mask island 8 and shown in Figures 12A and 12B. The vertical layers of the mask island include the thin oxide layer 3, the nitride layer 5 and the silicon dioxide layer 7.

Figure 13A:
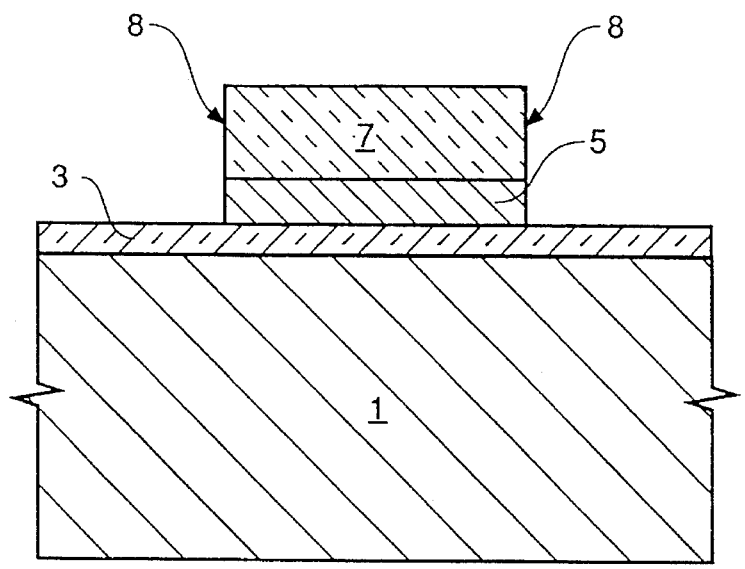
FIGS. 13A and 13B represent the in-process wafer portions of FIGS. 12A and 12B, respectively, following a reoxidation of the substrate and the removal of the photoresist oxide.
Figure 13B:
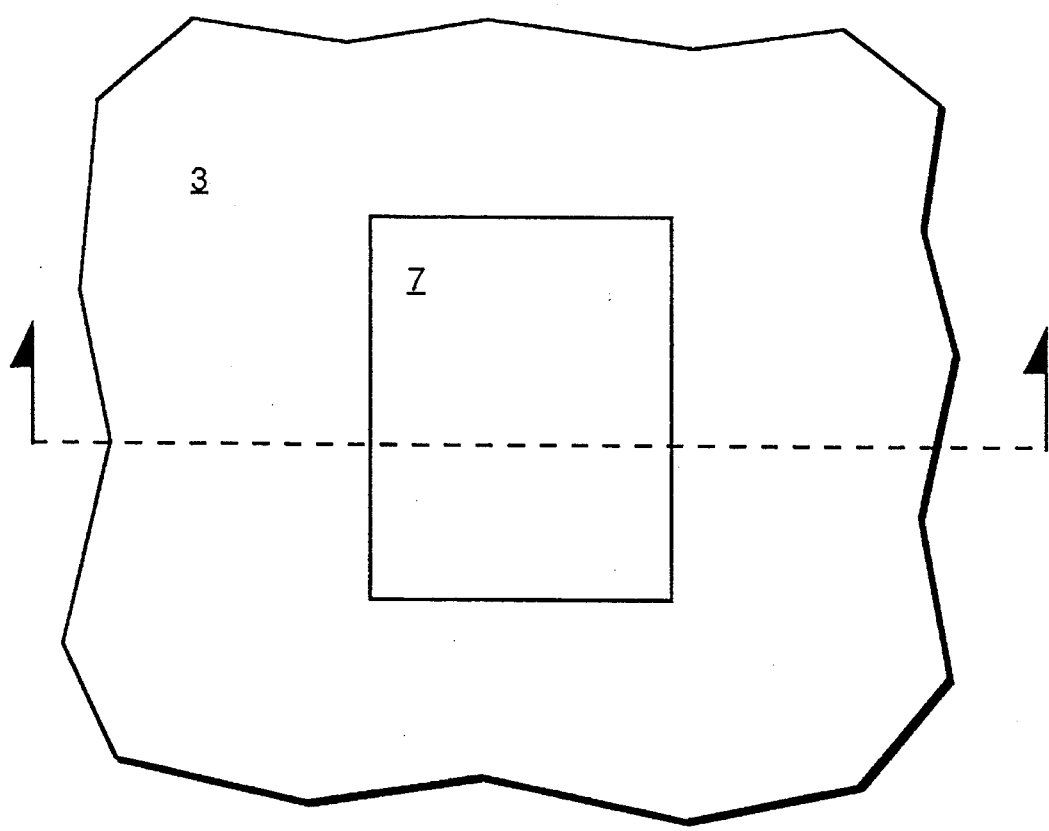

In FIGS. 13A and 13B, the primary photoresist mask 9 shown in FIGS. 12A and 12B is removed and the substrate is subjected to a thermal reoxidation in order to ensure that the thin oxide layer 3 remains intact. FIG. 13B clearly illustrates the region defined by the mask island 8.

Figure 14A:
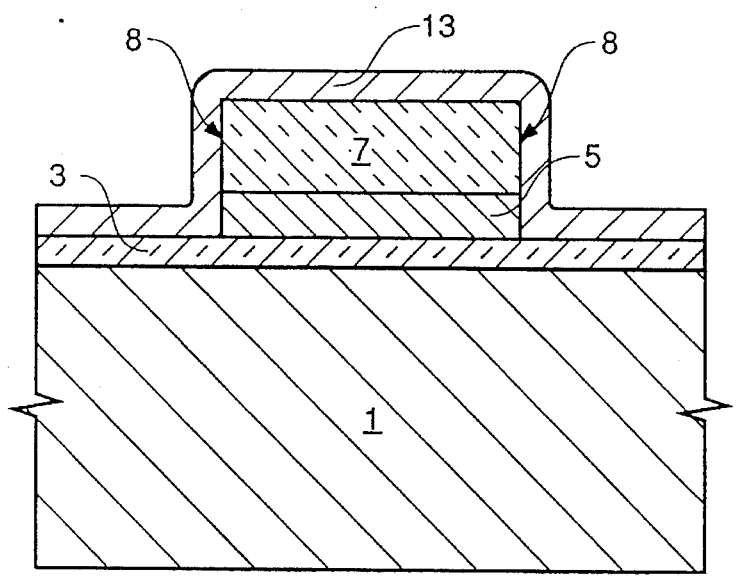
FIGS. 14A and 14B represent the in-process wafer portion of FIGS. 13A and 13B, respectively, following a polycrystalline silicon spacer deposition.
Figure 14B:
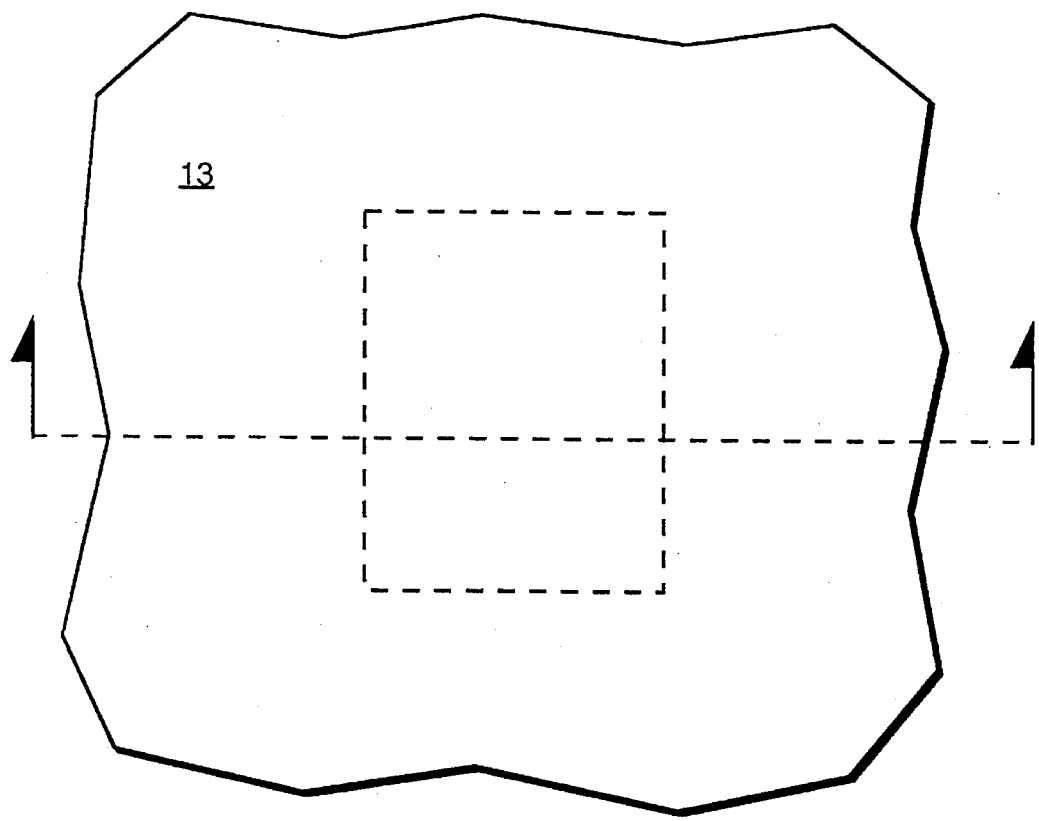

Referring now to FIG. 14A, a conformal expendable polycrystalline silicon spacer layer 13 is blanket deposited by LPCVD on the mask island 8 and thin oxide layer 3. It is important that the thickness of the polycrystalline silicon spacer layer 13 correspond, after deposition, to the desired thickness of the substrate trenches FIG. 14B depicts the blanket deposition of polycrystalline silicon on the in-process wafer.

Figure 15A:
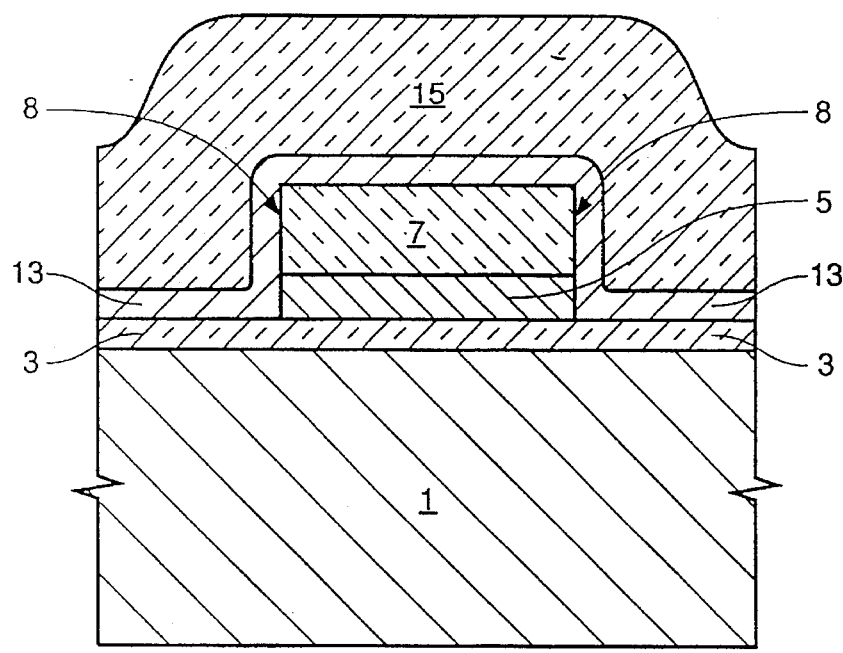
FIGS. 15A and 15B represent the in-process wafer portion of FIGS. 14A and 14B, respectively, following an oxide deposition.
Figure 15B:
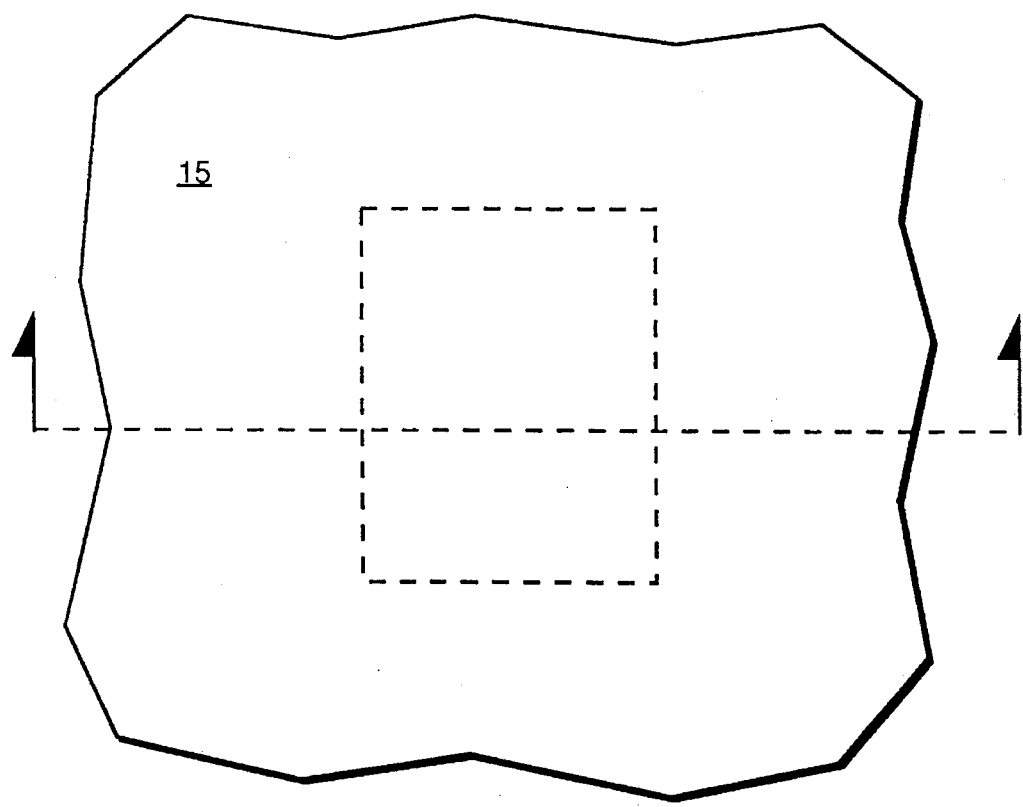

Referring to FIGS. 15A and 15B, a protective oxide layer 13 is blanket deposited on the polycrystalline silicon spacer layer by either LPCVD or by the tetra ethyl ortho silicate (TEOS) process. The polycrystalline silicon 13 having been selected for its high degree of selectivity with respect to its being etchable over the mask island and oxide layer 15.

Figure 16A:
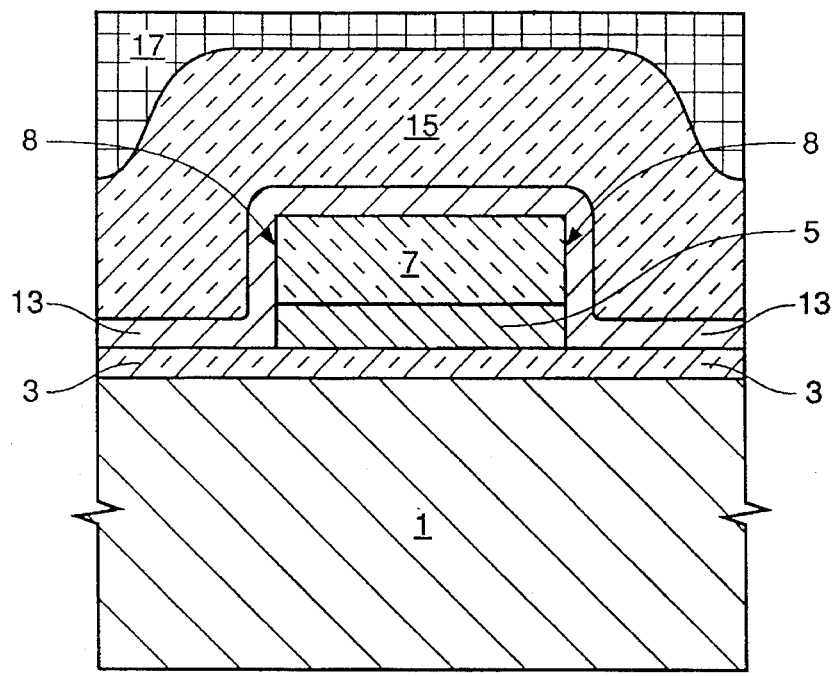
FIGS. 16A and 16B represent the in-process wafer portion of FIGS. 15A and 15B, respectively, following a photoresist application to planarize the wafer.
Figure 16B:
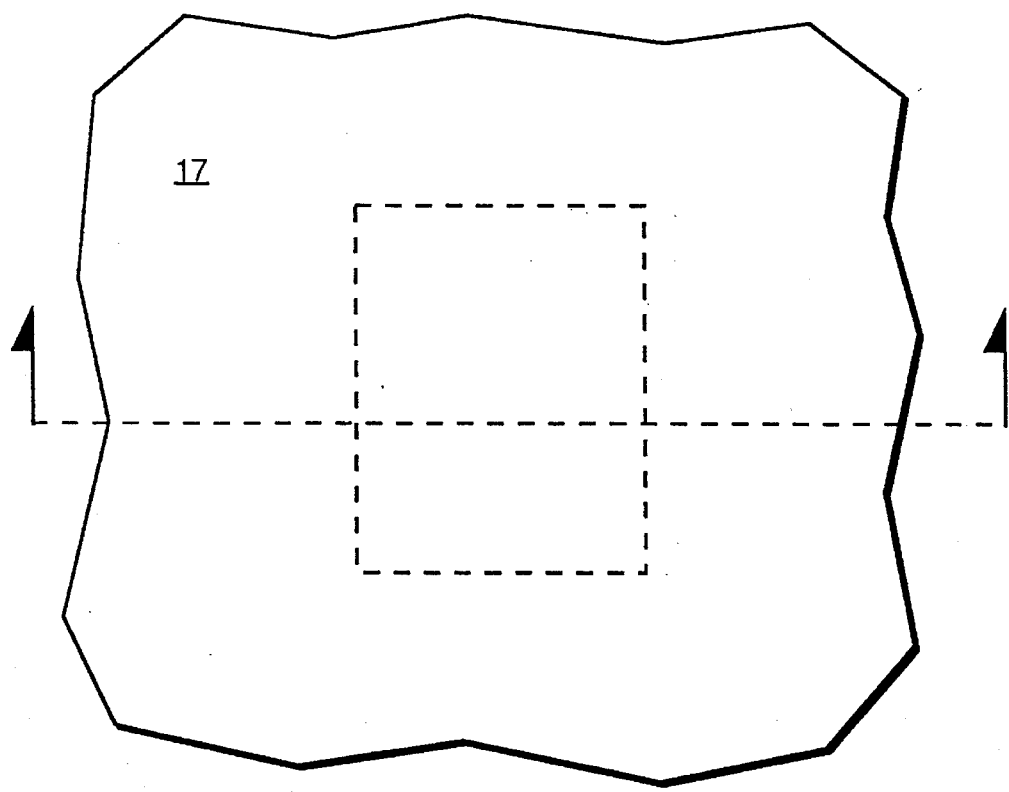

FIGS. 16A and 16B depict the final layerization of the wafer with a planarized layer of photoresist resin 17.

Figure 17A:
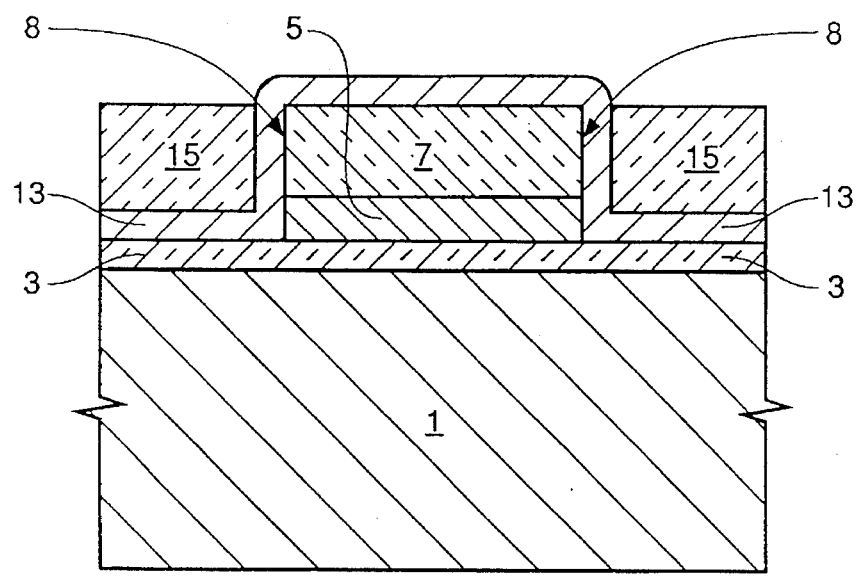
FIGS. 17A and 17B represent the in-process wafer portion of FIGS. 16A and 16B, respectively, following a uniform rate etch of the photoresist and final oxide deposit to expose the spacer deposition adjacent to and overlying the mask island.
Figure 17B:
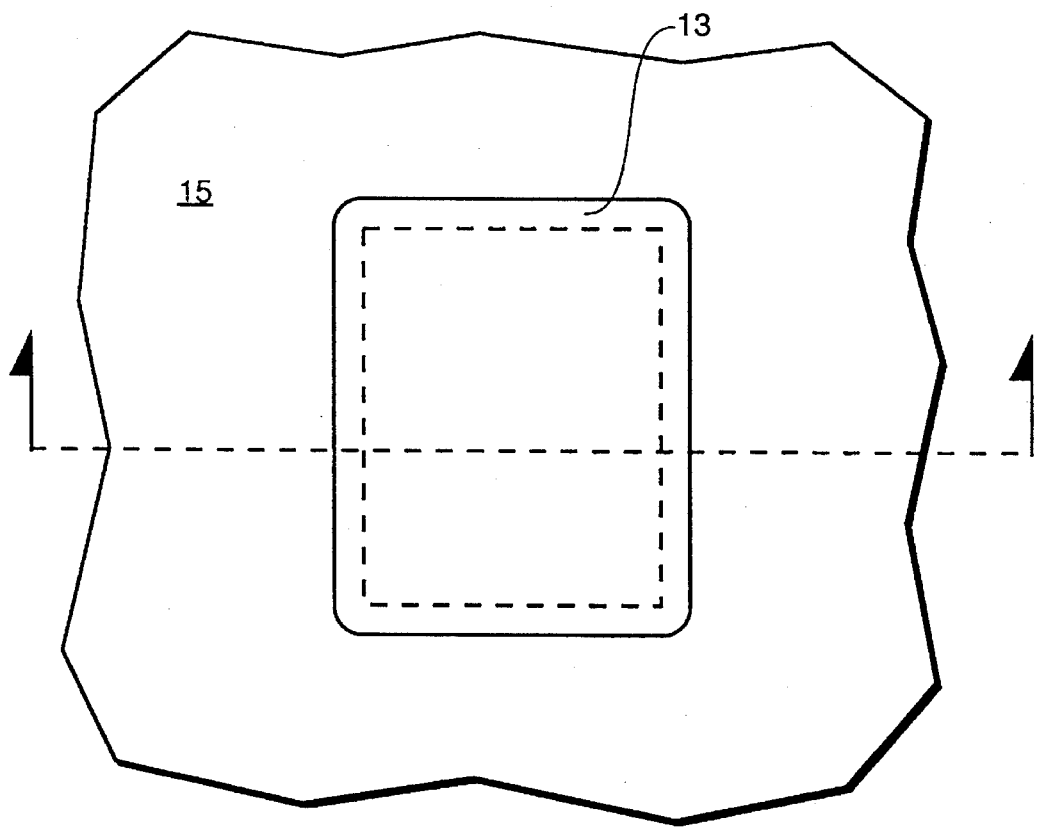

Referring to FIGS. 17A and 17B, the photoresist 17 and the oxide 15 are anisotropically etched with a plasma etch at the same rate to a level being at or below the top of the spacer layer 13 in order to expose the spacer layer 13 above the mask island 8 and vertically adjacent to the island and extending away from the island a distance equal to the thickness of the polycrystalline silicon deposition. The remaining deposition of oxide 15 protects the polycrystalline silicon 13 that was not exposed by the etch. FIG. 17B illustrates the fact that there is now an island of polycrystalline silicon 13 resulting from the etching of the photoresist 17 and oxide 15. Alternately it is possible to eliminate the planarization of the wafer with photoresist and, instead, mechanically etch the oxide layer 15 to a level being at or below the top of the spacer layer 13 in order to expose the polycrystalline silicon spacer layer 13 of FIGS. 17A and 17B. It is also possible to planarize a portion of the polycrystalline silicon spacer 13 layer during the previous mechanical and plasma etches to the same level as the protective oxide layer. We now have a mask for defining narrow isolated trenches in the substrate.

Figure 18A:
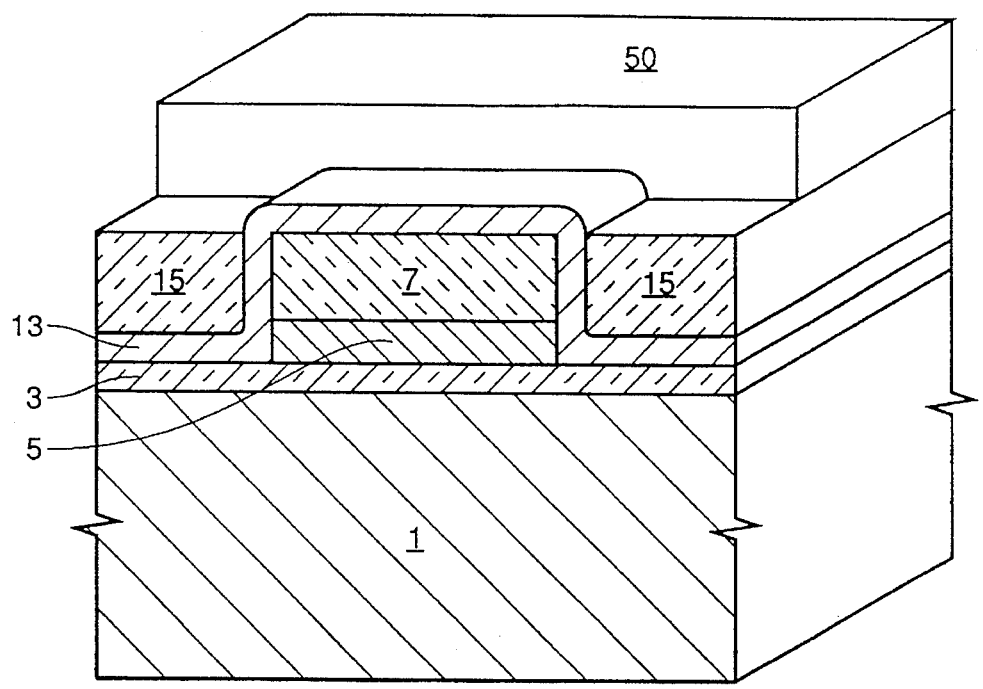
FIGS. 18A and 18B represent the in-process wafer portion of FIGS. 17A and 17B, respectively, following the masking, with an edge mask, of two opposing ends of the spacer layer adjacent to the mask island.
Figure 18B:
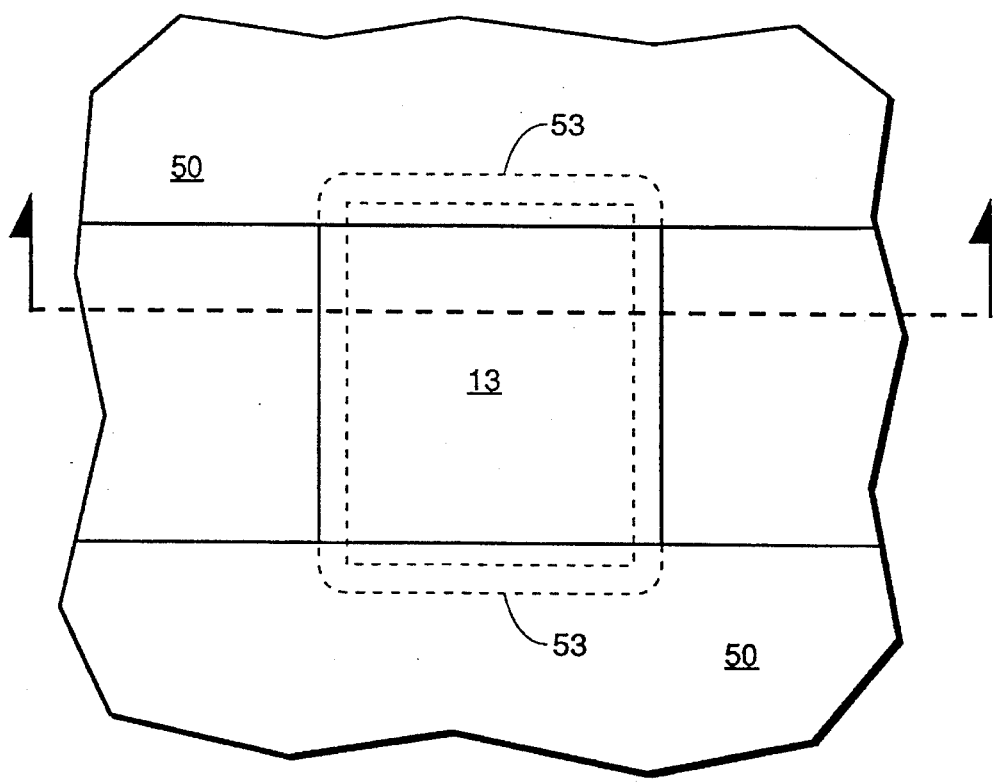

In FIGS. 18A and 18B a photoresist mask 50 is formed to protect two opposing ends 53 of the exposed polycrystalline silicon spacer layer 13 from being etched during subsequent etch steps. More particularly the photoresist mask 50 protects the spacer layer adjacent to the opposing ends of the mask island 8.

Figure 19A:
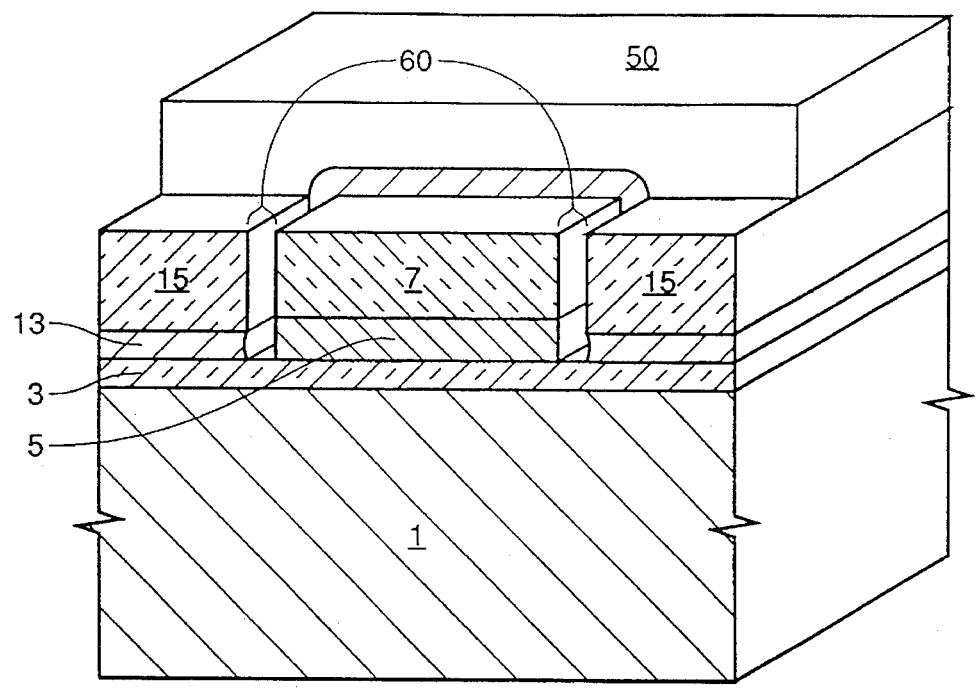
FIGS. 19A and 19B represent the in-process wafer portion of FIGS. 18A and 18B, respectively, following a polycrystalline silicon selective etch.
Figure 19B:
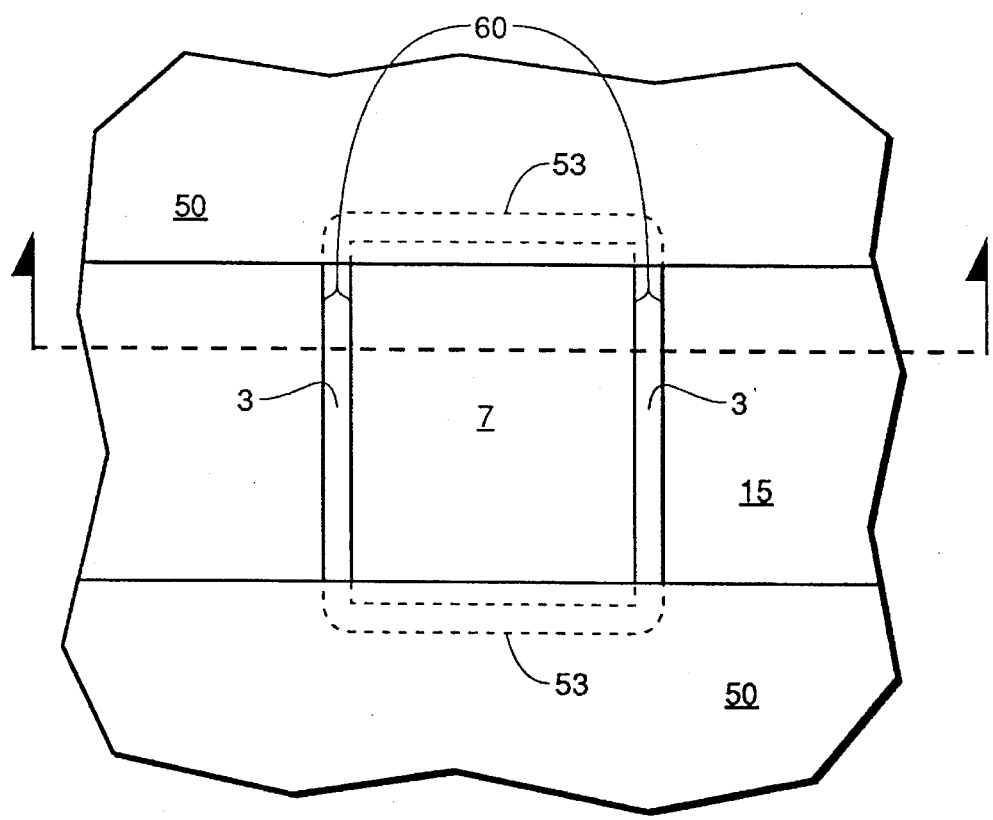

FIGS. 19A and 19B depict the result of isotropically etching the exposed polycrystalline silicon 13 in unmasked areas adjacent to and capping the mask island 8. The polycrystalline silicon 13 protected by the remaining oxide 15 and protected by the photoresist mask 50 is not etched. The result of the polycrystalline silicon etch is two narrow isolated spacings 60, whose sidewalls comprise two opposing sides of the initial mask island 8 and the oxide 15. At this juncture the floor of the narrow isolated spacings 60 consists of the thin oxide layer 3 exposed during the polycrystalline silicon etch. The width of the narrow isolated spacings 60 is equal to the original thickness of the polycrystalline silicon layer 13.

Figure 20A:
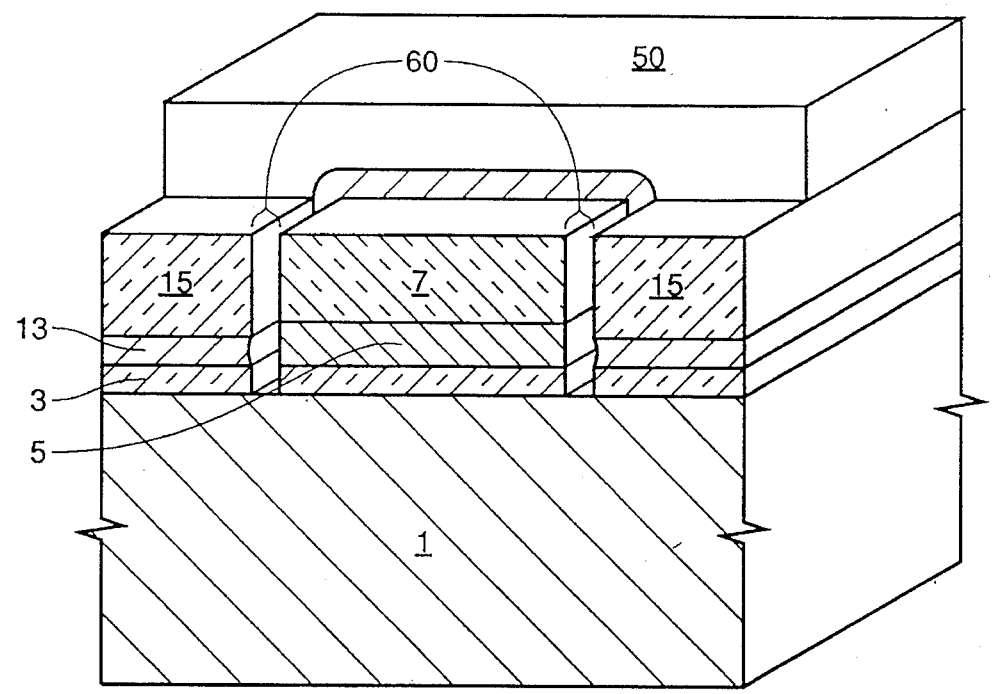
FIGS. 20A and 20B represent the in-process wafer portion of FIGS. 19A and 19B, respectively, following an etch of the thin oxide layer.
Figure 20B:
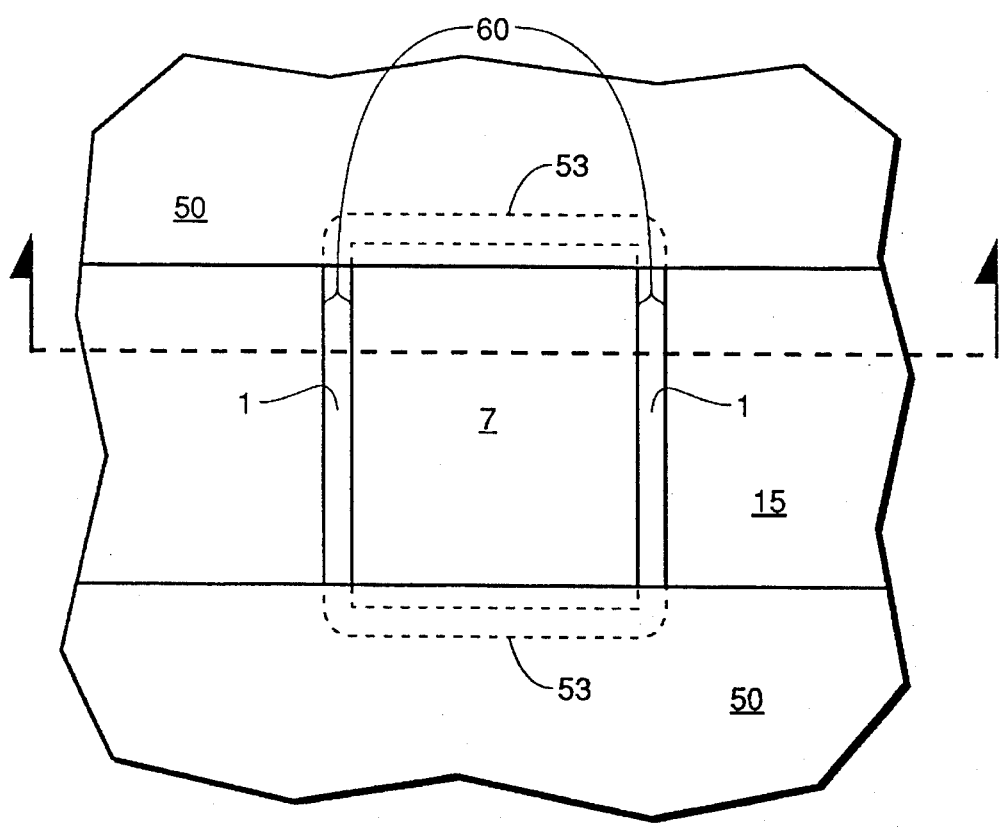

In FIGS. 20A and 20B the thin oxide layer 3 forming the floor of the narrow isolated spacings 60 is now over-etched to expose the substrate 1.

Figure 21A:
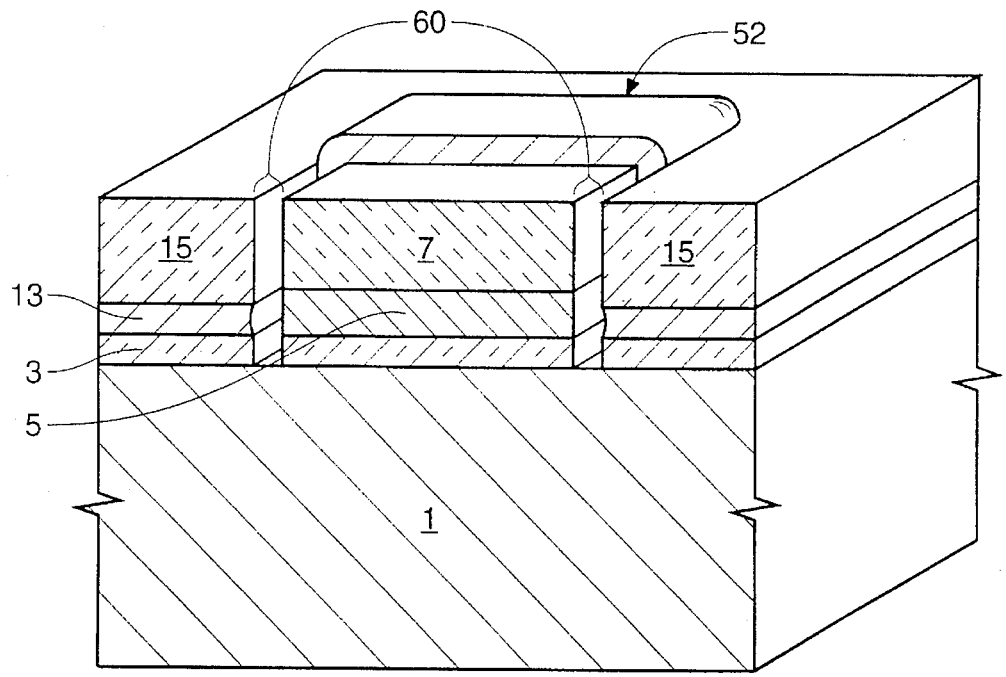
FIGS. 21A and 21B represent the in-process wafer portion of FIGS. 20A and 20B, respectively, following the removal of the trench mask.
Figure 21B:
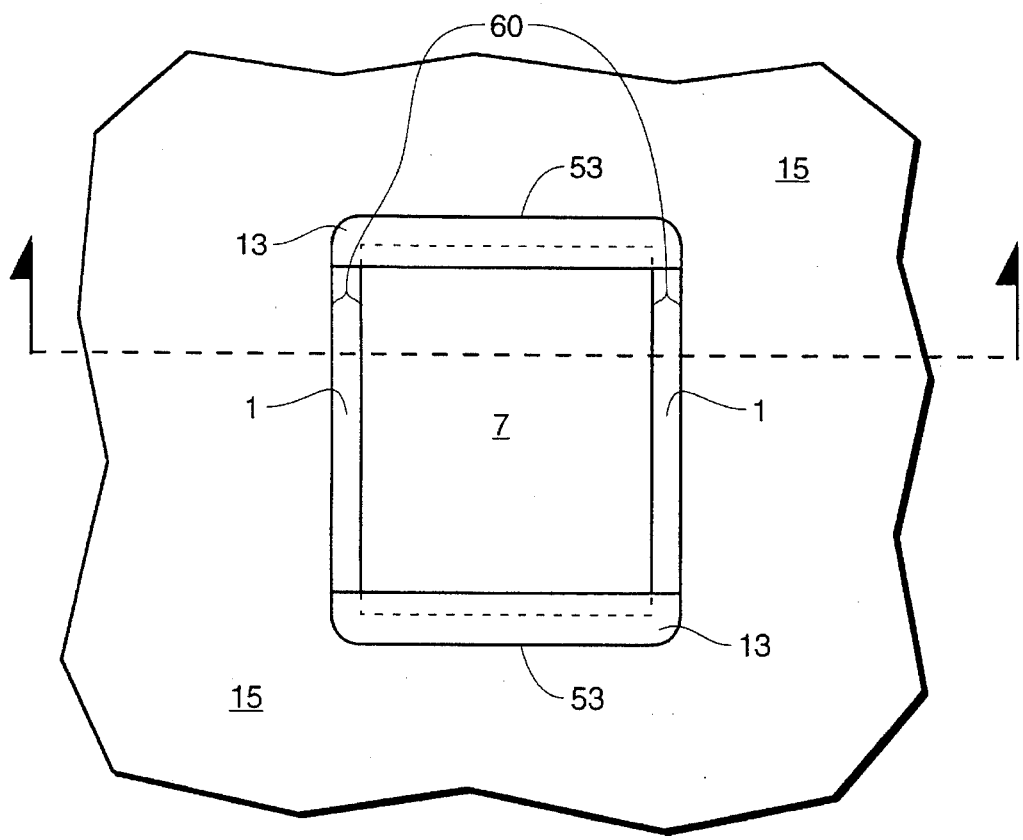

In FIGS. 21A and 21B the photoresist mask 50 shown in FIGS. 20A and 20B is removed. The vertical film layer segments are patterned with narrow isolated spacings 60. The width of the narrow isolated spacings 60 is highly predictable and very narrow, limited only by the limit of the thickness of the polycrystalline silicon layer 13. A further aspect of the invention comprises formation of narrow isolated trenches.

Figure 22A:
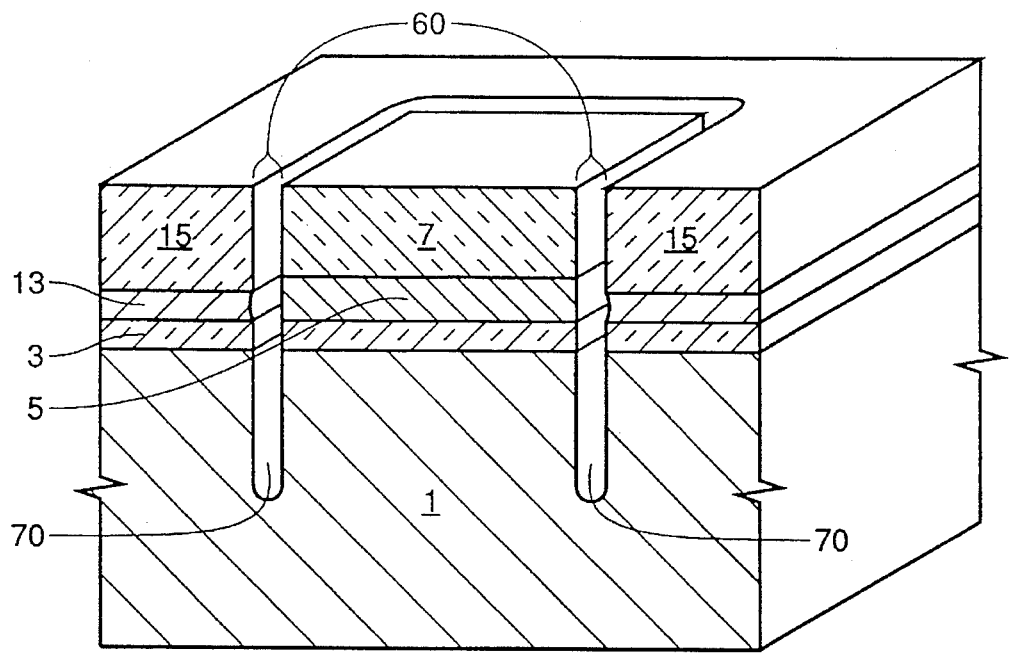
FIG. 22A and 22B represent the in-process wafer portion of FIGS. 21A and 21B, respectively, following an etch to form trenches in the substrate and trenches adjacent to opposing ends of the mask island.
Figure 22B:
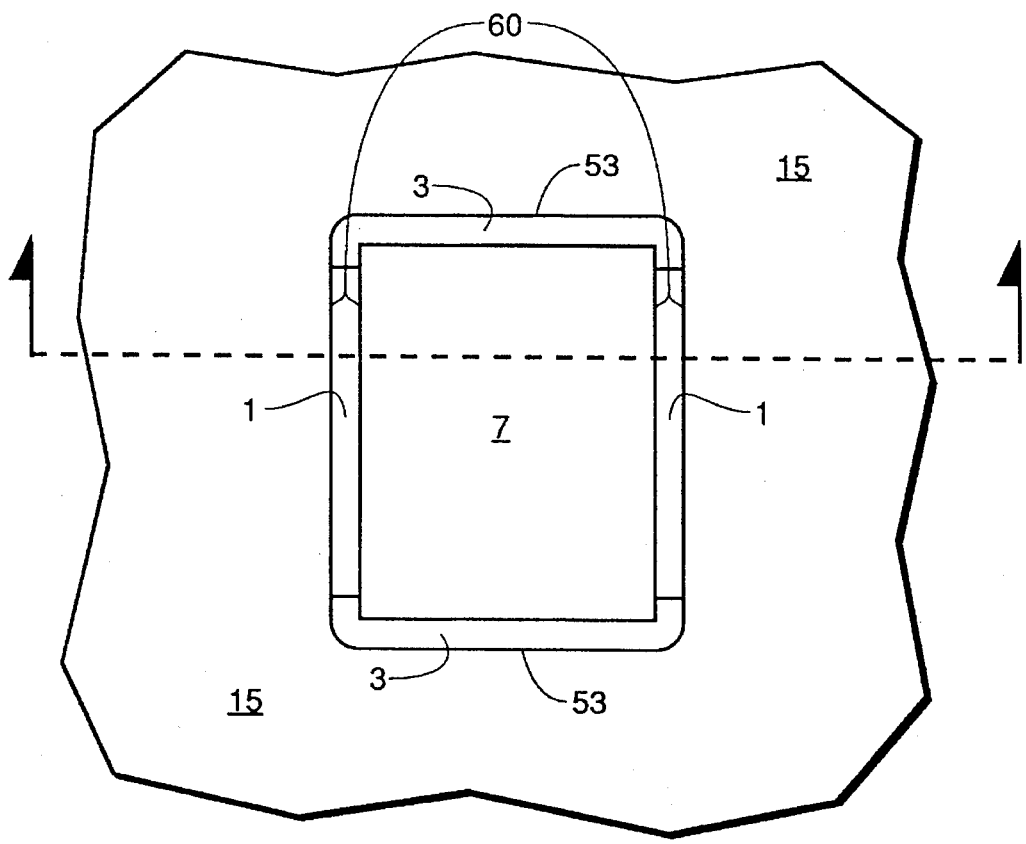

In FIGS. 22A and 22B the narrow isolated trenches 70 are etched in the exposed substrate 1 using an anisotropic process that is highly selective for silicon. The width of the narrow isolated trenches 70 is defined by the width of the narrow isolated spacings 60 and are therefore equal in width to the depth of the polycrystalline silicon layer 13. Thus the width of narrow isolated trenches is only limited by the deposition limits of the polycrystalline silicon layer 13. The substrate 1 and polycrystalline silicon layer 13 at the opposing ends 53 are etched at nearly the same rate and the etch is terminated before the entire thin oxide layer 3 is removed in the opposing ends 53. Thus the depth of the narrow isolated trenches 70 may at least be equal to the vertical height measured from the top surface of the thin oxide layer 3 to the top surface 52 of the initially deposited polycrystalline silicon layer 13 as shown in FIG. 21A, in the case where none of the thin oxide layer 3 in the opposing ends 53 is etched. Typically more of the substrate 1 will be consumed by the etch than the oxide 3 consumed by the etch, thereby increasing the depth of the narrow isolated trenches when portions of the oxide 3 are etched.

Figure 23A:
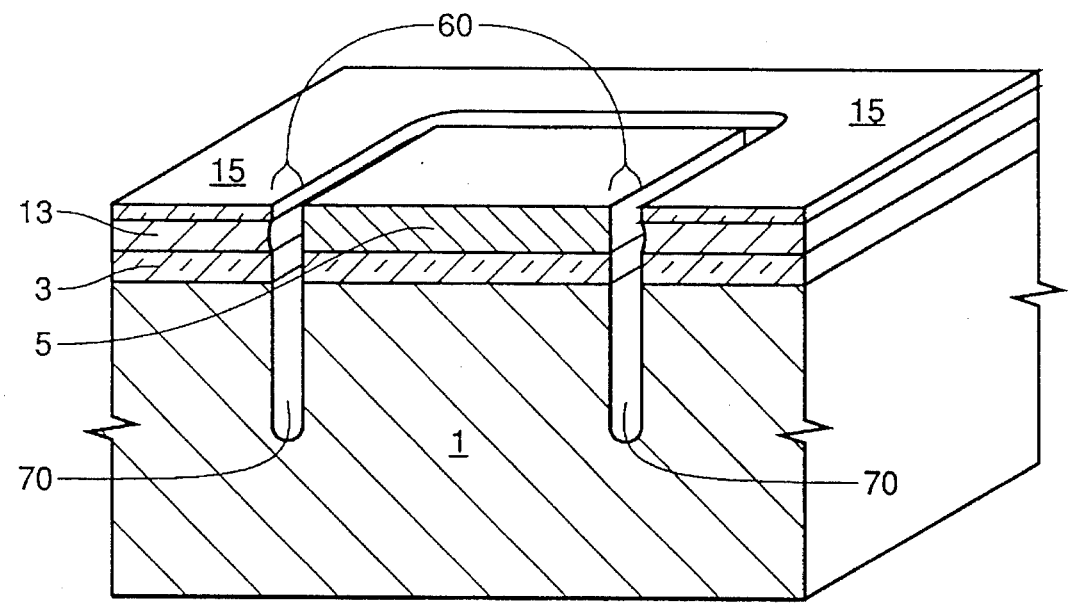
FIGS. 23A and 23B represent the in-process wafer portion of FIGS. 22A and 22B, respectively, following a chemical mechanical planarization (CMP) of the oxide layer and silicon dioxide layers.
Figure 23B:
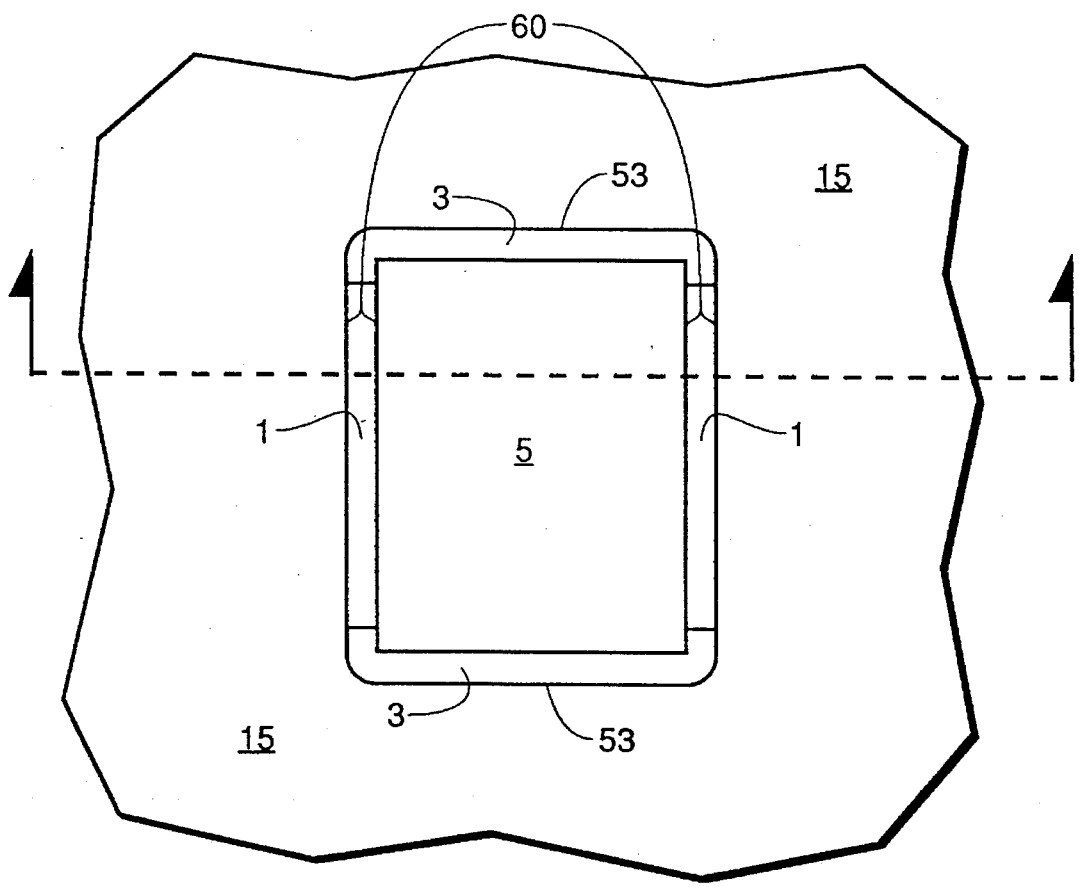

In FIGS. 23A and 23B the oxide layer 15 and the silicon dioxide layer 7 are chemically mechanically planarized (CMP) to expose the nitride layer 5. However, some designers may wish to eliminate this step incorporating this planarization with the planarization of the subsequent oxide deposit.

Figure 24A:
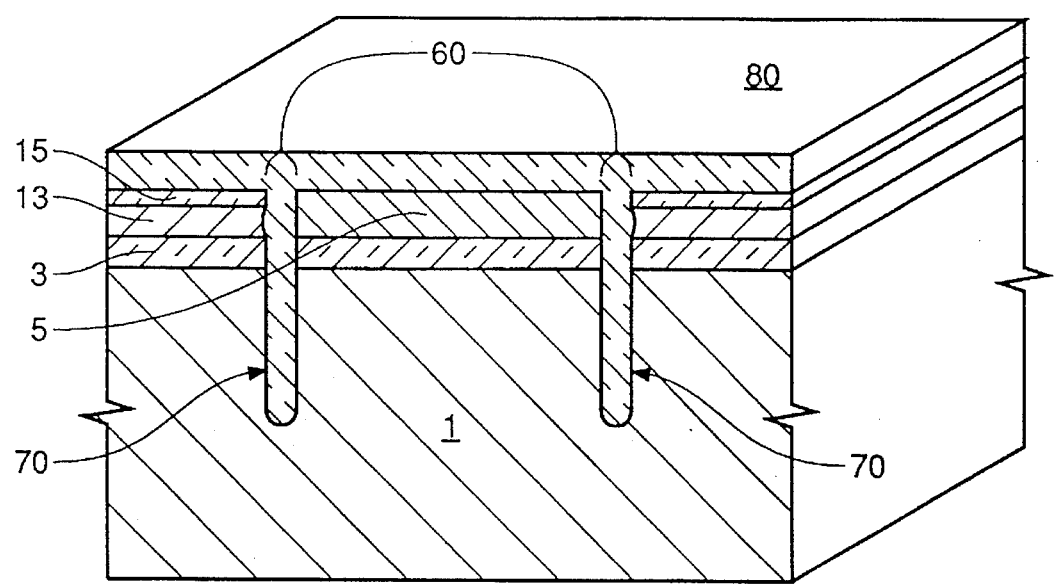
FIGS. 24A and 24B represent the in-process wafer portion of FIGS. 23A and 23B, respectively, following an oxide deposition to fill the trenches.
Figure 24B:
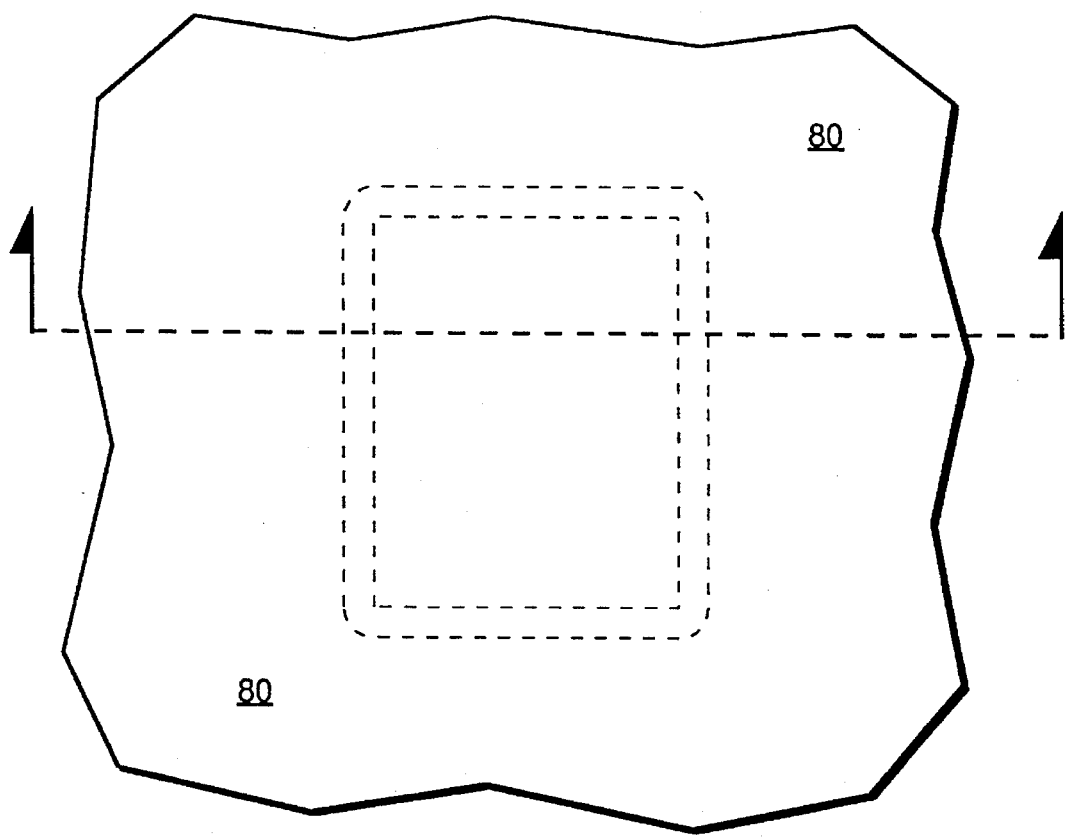

In FIGS. 24A and 24B oxide 80 is deposited to fill the narrow isolated trenches 70 and the narrow isolated spacings 60 and to overlie the oxide 13 and nitride 5. Optionally the oxide 80 may be thermally grown in a diffusion oven from each sidewall of the trenches. This oxide growth is possible because the trenches are so narrow. A $0.2\mu$ trench will consume only $0.1\mu$ of silicon. This is equal to the radius of the trench and will therefore fill it. In either case, minimal oxide is needed because of the narrowness of the trenches.

Figure 25A:
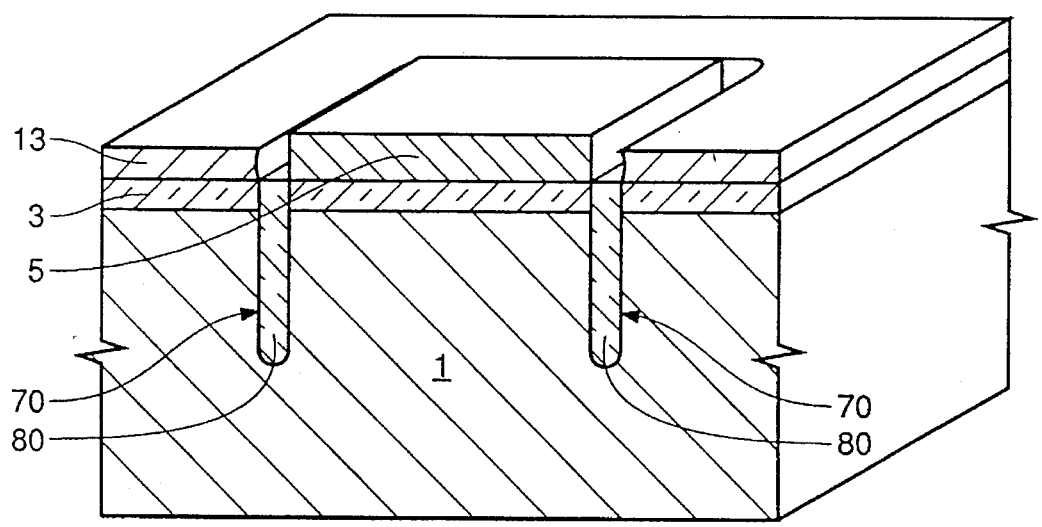
FIGS. 25A and 25B represent the in-process wafer portion of FIGS. 24A and 24B, respectively, following the removal of the oxide deposition overlying the spacer deposition and nitride.
Figure 25B:
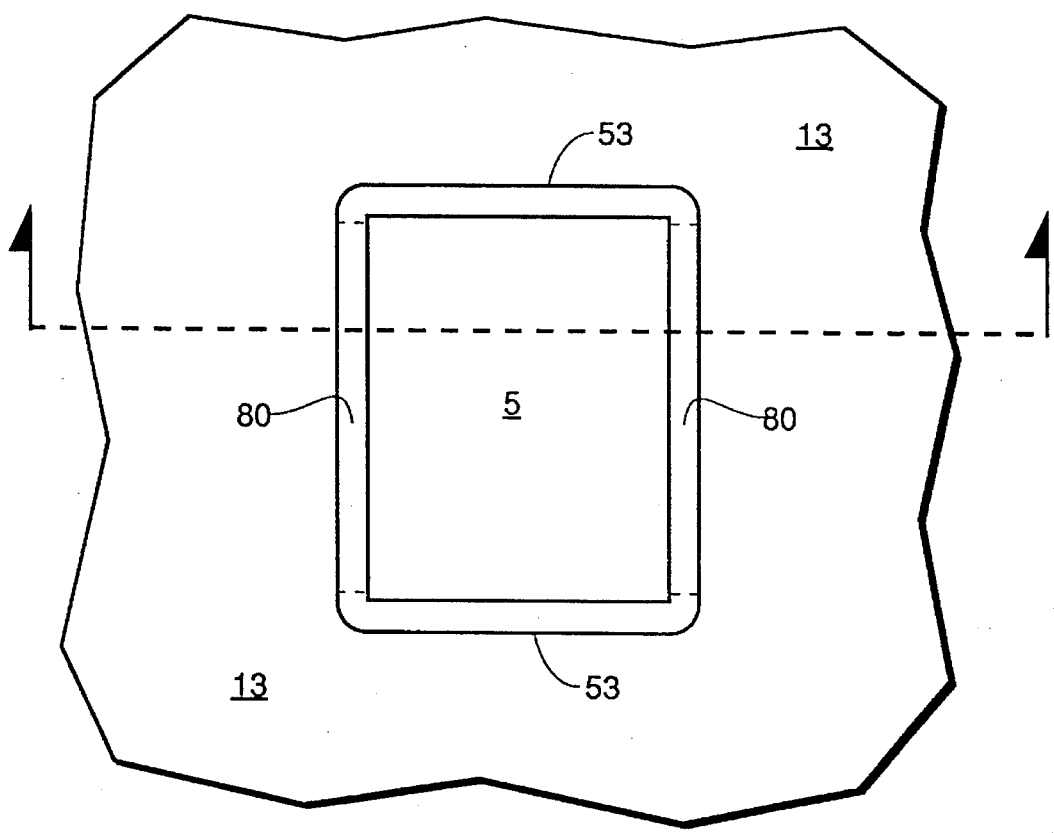

In FIGS. 25A and 25B the oxide 80 is chemically mechanically planarized and then dipped off retaining oxide in the narrow isolated trenches 70 and in cavities interposed in the thin oxide layers 3. The height of the oxide 80 being limited to the upper surface of the oxide layers 3.

Figure 26A:
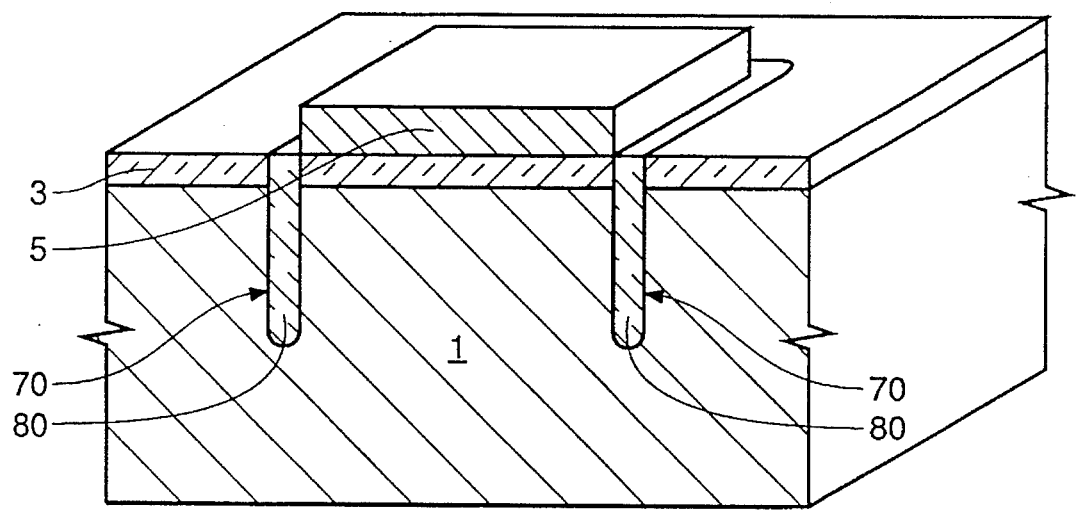
FIGS. 26A and 26B represent the in-process wafer portion of FIGS. 25A and 25B, respectively, following a final etch of the spacer deposition.
Figure 26B:
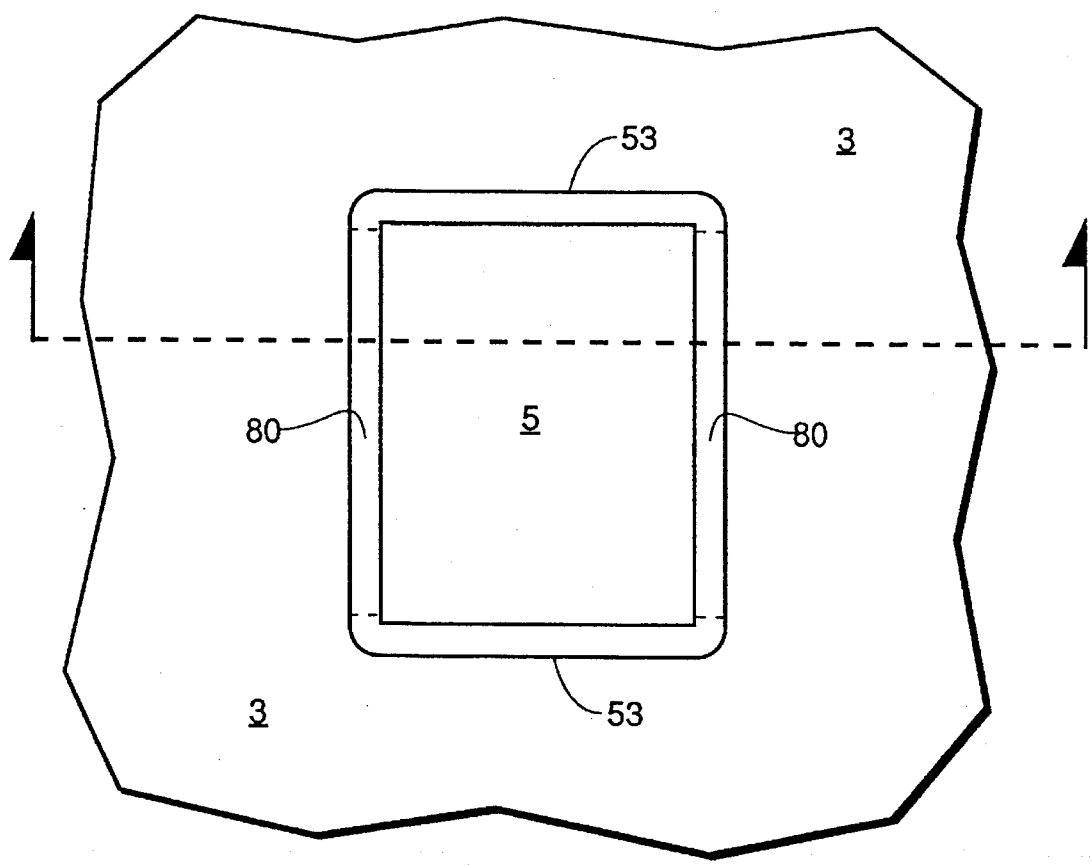

In FIGS. 26A and 26B the polycrystalline silicon layer 13 shown in FIGS. 25A and 25B is etched leaving the nitride layer 5 and the thin oxide layer 3.

Figure 27A:
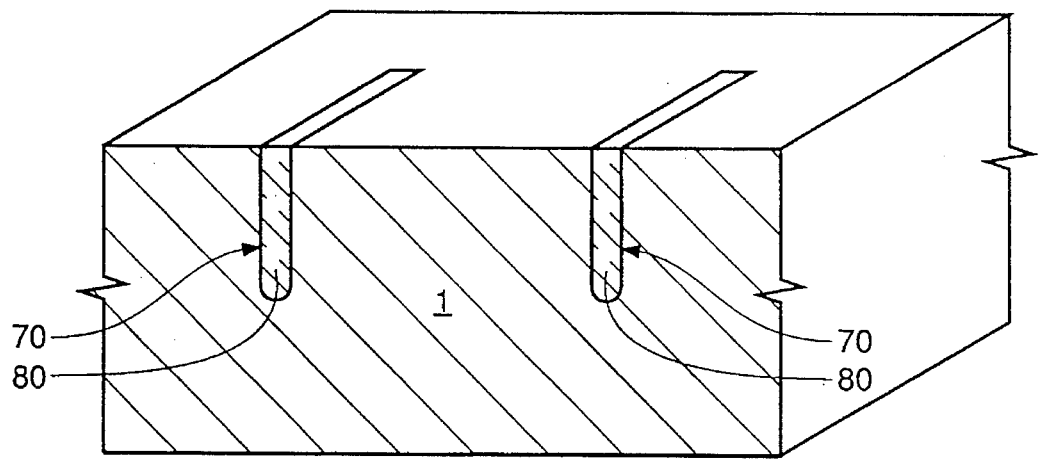
FIGS. 27A and 27B depict the secondary mask defining 4 narrow isolated spacings.
Figure 27B:
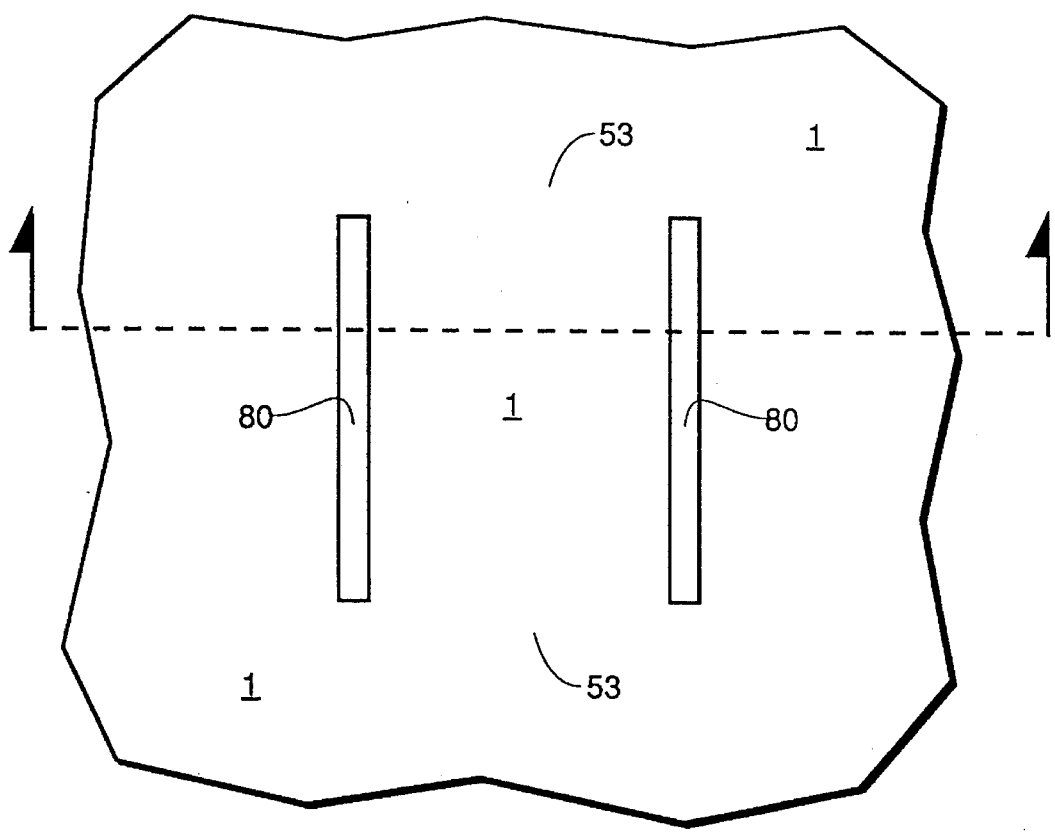

In FIGS. 27A and 27B the process has been completed by etching first the nitride layer 5 and then chemically mechanically planarizing the thin oxide layer 3 shown in FIGS. 26A and 26B. Oxidized trenches fabricated with the trench mask of the invention have a narrow width exactly equal to the thickness of the polycrystalline silicon deposition spacer layer 13, thus facilitating even denser circuit fabrication. The method of forming trenches in this embodiment results in the exact placement and a predictable width of the isolation trenches. These facts, coupled with the minimum masking steps this method entails, creates a significant advance in the fabrication of isolated trenches.

Figure 28A:
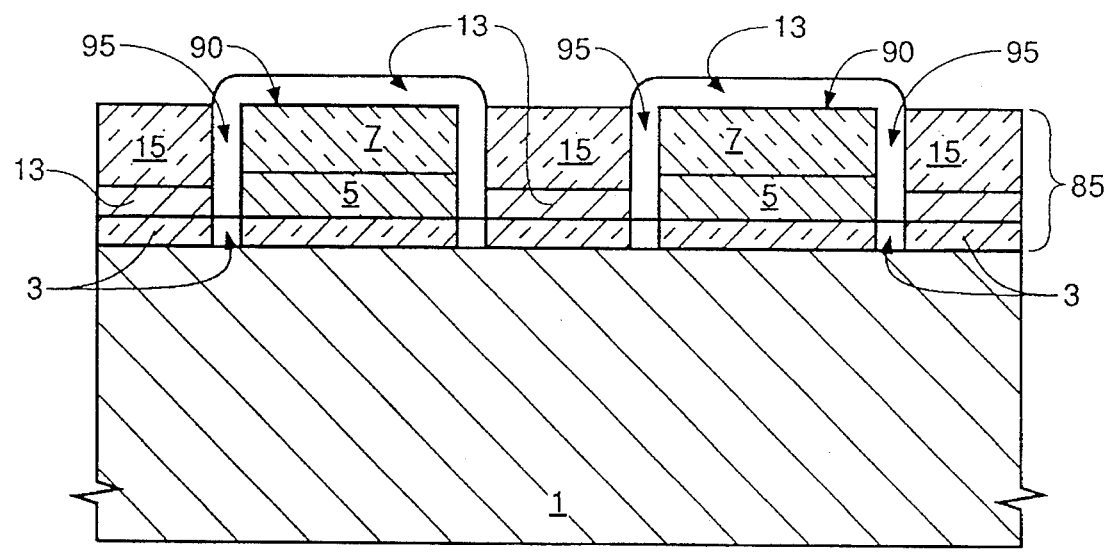
FIGS. 28A and 28B represent the in-process wafer portion of FIGS. 27A and 27B, depicting the 4 narrow isolated trenches formed according to the secondary mask of FIGS. 27A and 27B and filled with oxide.
Figure 28B:
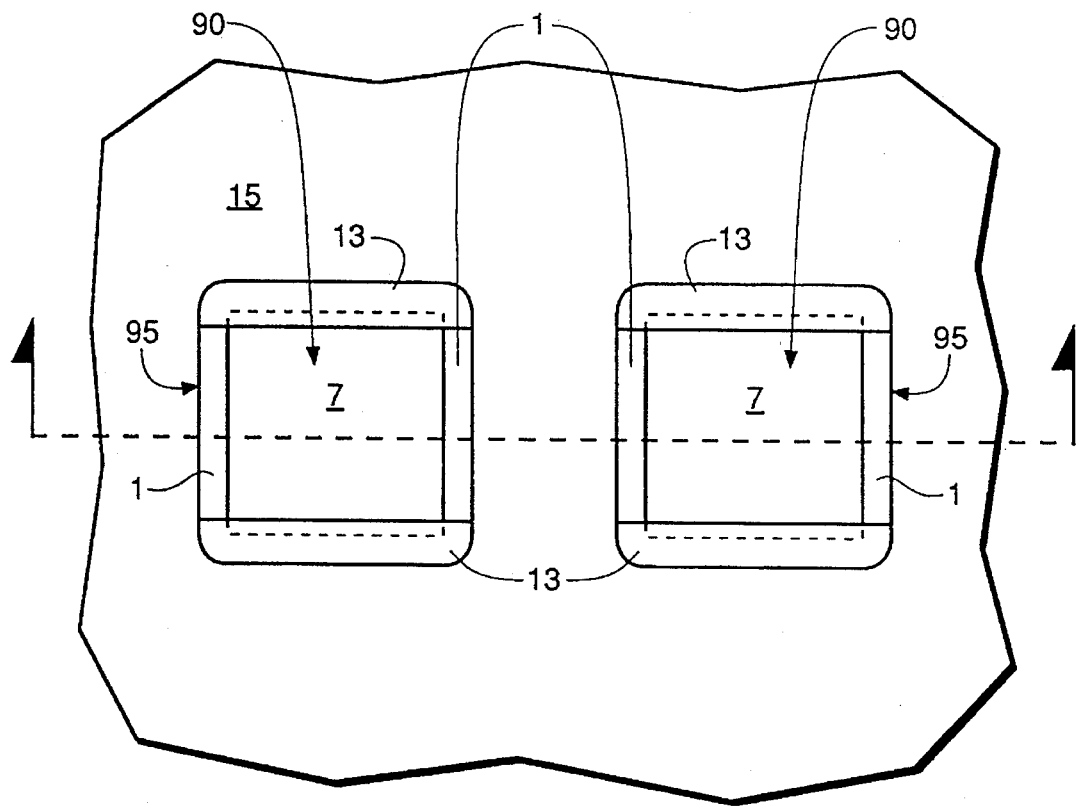

FIGS. 28A and 28B are a representation of the trench mask 85 of the invention wherein more than one mask island 90 is utilized to fabricate more than two narrow isolated spacings 95 in the trench mask 85. Said representation is indicative of the fabrication of any plurality of narrow isolated spacings in a trench mask, wherein the number of narrow isolated spacings is equal to twice the number of mask islands.

Figure 29A:
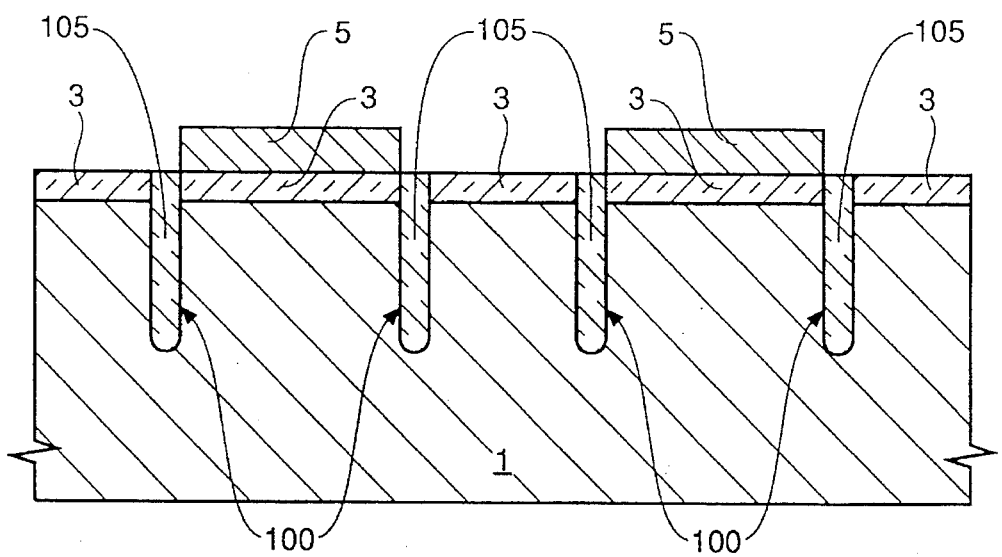
FIGS. 29A and 29B represent the in-process wafer following the formation of trenches fabricated according to the trench mask shown in FIGS. 28A and 28B.
Figure 29B:
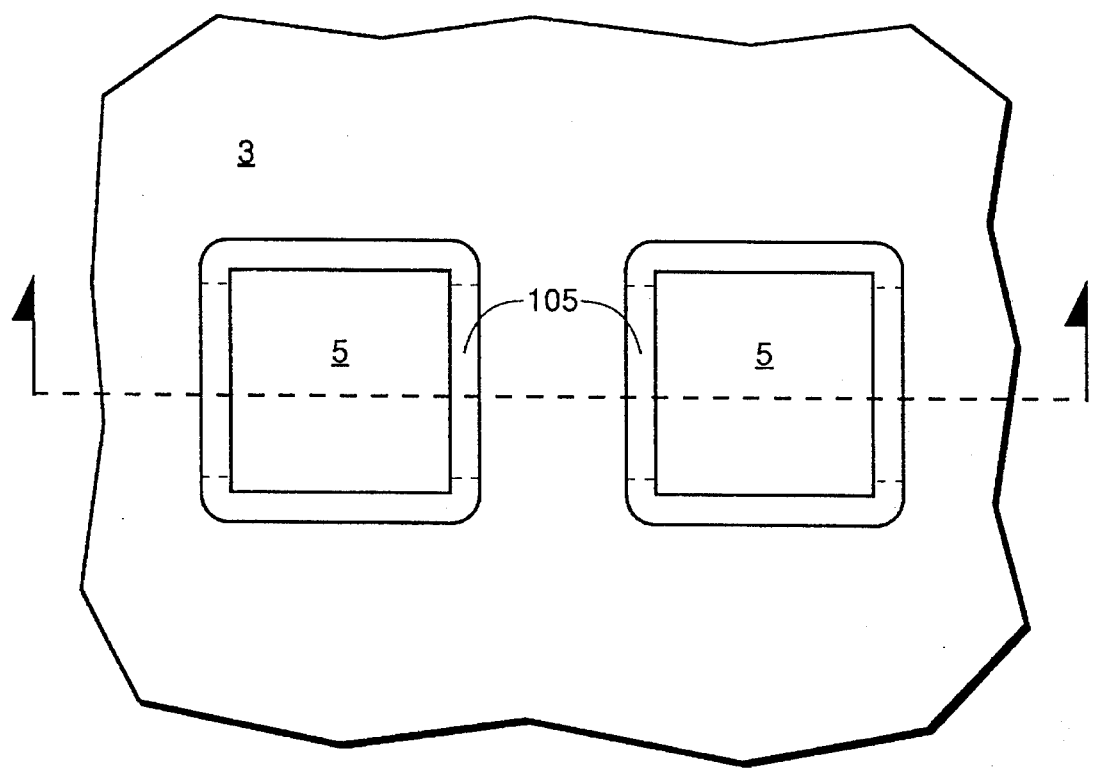

FIGS. 29A and 29B depict narrow isolated trenches 100 fabricated according to the trench mask 85 as shown in FIGS. 28A and 28B. The narrow isolated trenches 100 have been filled with oxide 105.

Although variations to the invention as described are possible, it will be apparent to one of ordinary skill in the art that changes may be made thereto without departing from the spirit and the scope of the process as claimed.

We claim:
1. An etch mask comprising:
   a) a first layered segment overlying a starting substrate;
   b) a second layered segment overlying the starting substrate and surrounding a perimeter of said first layered segment and separated from said first layered segment by a separation distance; and
   c) a spacer layer having a thickness equal to the separation distance, said spacer layer interposed between and adjacent to a first portion of said first layered segment and a first portion of said second layered segment, a void formed between a second portion of said first layered segment and a second portion of said second layered segment, wherein said first and second layered segments are inorganic.

2. The etch mask as specified in claim 1, wherein said second layered segment comprises:
   a) a horizontal spacer layer overlying said starting substrate and substantially horizontal to said starting substrate, said horizontal spacer layer having a thickness equal to a thickness of said vertical spacer layer; and
   b) a protective layer overlying said horizontal spacer layer.

3. The etch mask as specified in claim 2, wherein said horizontal spacer layer and said vertical spacer layer are distinctly etchable over said protective layer and said first layered segment.

4. The etch mask as specified in claim 2, wherein oxidized substrate is interposed between said horizontal spacer layer and said starting substrate.

5. The etch mask as specified in claim 2, wherein said horizontal and vertical spacer layers are polycrystalline silicon.

6. The etch mask as specified in claim 2, wherein said protective layer is an oxide.

7. The etch mask as specified in claim 1, wherein said first layered segment comprises a first layer overlying said substrate and a second layer overlying said first layer.

8. The etch mask as specified in claim 7, wherein said first layer is nitride.

9. The etch mask as specified in claim 7, wherein said second layer is silicon dioxide.

10. The etch mask as specified in claim 7, wherein a layer of oxidized substrate is interposed between said starting substrate and said first layer.

\* \* \* \* \*